(12) United States Patent
Nazarian et al.

(10) Patent No.: US 9,576,616 B2
(45) Date of Patent: Feb. 21, 2017

(54) NON-VOLATILE MEMORY WITH OVERWRITE CAPABILITY AND LOW WRITE AMPLIFICATION

(71) Applicant: Crossbar, Inc., Santa Clara, CA (US)

(72) Inventors: Hagop Nazarian, San Jose, CA (US); Sang Nguyen, Union City, CA (US)

(73) Assignee: CROSSBAR, INC., Santa Clara, CA (US)

( * ) Notice: Subject to any disclaimer, the term of this patent is extended or adjusted under 35 U.S.C. 154(b) by 342 days.

(21) Appl. No.: 13/952,467

(22) Filed: Jul. 26, 2013

(65) Prior Publication Data

US 2014/0098619 A1   Apr. 10, 2014

Related U.S. Application Data

(60) Provisional application No. 61/785,979, filed on Mar. 14, 2013, provisional application No. 61/712,171, filed on Oct. 10, 2012.

(51) Int. Cl.
*G11C 7/00* (2006.01)
*G11C 13/00* (2006.01)

(52) U.S. Cl.
CPC .............. *G11C 7/00* (2013.01); *G11C 13/004* (2013.01); *G11C 13/0007* (2013.01); *G11C 13/0023* (2013.01); *G11C 13/0026* (2013.01); *G11C 13/0028* (2013.01); *G11C 13/0061* (2013.01); *G11C 13/0069* (2013.01); *G11C 2213/78* (2013.01); *Y10T 29/49002* (2015.01)

(58) Field of Classification Search
USPC ........................... 365/158, 148, 163, 189.02
See application file for complete search history.

(56) References Cited

U.S. PATENT DOCUMENTS

| 680,652 A | 8/1901 | Leonard |
| 4,433,468 A | 2/1984 | Kawamata |

(Continued)

FOREIGN PATENT DOCUMENTS

| CN | 101131872 A | 2/2008 |
| CN | 101170132 A | 4/2008 |

(Continued)

OTHER PUBLICATIONS

International Search Report and Written Opinion for Application No. PCT/US2012/044077, mailed on Jan. 25, 2013, 3 pages.

(Continued)

*Primary Examiner* — Huan Hoang
*Assistant Examiner* — Minh Dinh
(74) *Attorney, Agent, or Firm* — Amin, Turocy & Watson, LLP

(57) ABSTRACT

Providing for a non-volatile memory architecture having write and overwrite capabilities providing low write amplification to a storage system is described herein. By way of example, a memory array is disclosed comprising blocks and sub-blocks of two-terminal memory cells. The two-terminal memory cells can be directly overwritten in some embodiments, facilitating a write amplification value as low as one. Furthermore, the memory array can have an input-output multiplexer configuration, reducing sneak path currents of the memory architecture during memory operations.

22 Claims, 11 Drawing Sheets

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 * | 11/2004 | Lu .................... G11C 11/16 365/158 |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |

(56) References Cited

U.S. PATENT DOCUMENTS

| | | |
|---|---|---|
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1* | 2/2007 | Hush ............... G11C 13/0004 365/163 |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1* | 10/2009 | De Ambroggi ....... G11C 11/005 365/163 |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0321706 A1 | 12/2009 | Happ et al. |
| 2009/0321789 A1 | 12/2009 | Wang et al. |

(56) References Cited

U.S. PATENT DOCUMENTS

| | | |
|---|---|---|
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0134379 A1 | 5/2013 | Lu |
| 2013/0166825 A1* | 6/2013 | Kim .................. G06F 12/0246 711/103 |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |

(56) References Cited

U.S. PATENT DOCUMENTS

| | | | |
|---|---|---|---|
| 2015/0070961 | A1 | 3/2015 | Katayama et al. |
| 2015/0228334 | A1 | 8/2015 | Nazarian et al. |
| 2016/0111640 | A1 | 4/2016 | Chang et al. |

FOREIGN PATENT DOCUMENTS

| | | | |
|---|---|---|---|
| CN | 101501850 A | | 8/2009 |
| CN | 101636792 A | | 1/2010 |
| CN | 102024494 A | | 4/2011 |
| CN | 102077296 A | | 5/2011 |
| EP | 1096465 A2 | | 5/2001 |
| EP | 2405441 A1 | | 1/2012 |
| EP | 2408035 A2 | | 1/2012 |
| JP | 2005506703 A | | 3/2005 |
| JP | 2006032951 A | | 2/2006 |
| JP | 2007067408 A | | 3/2007 |
| JP | 2007281208 A | | 10/2007 |
| JP | 2007328857 A | | 12/2007 |
| JP | 2008503085 A | | 1/2008 |
| JP | 2008147343 A | | 6/2008 |
| JP | 2009043873 A | | 2/2009 |
| JP | 2011023645 A | | 2/2011 |
| JP | 2011065737 A | | 3/2011 |
| JP | 2012504840 A | | 2/2012 |
| JP | 2012505551 A | | 3/2012 |
| JP | 2012089567 A | | 5/2012 |
| JP | 2012533195 A | | 12/2012 |
| KR | 20090051206 A | | 5/2009 |
| KR | 20110014248 A | | 2/2011 |
| WO | 03034498 A1 | | 4/2003 |
| WO | 2005124787 A2 | | 12/2005 |
| WO | 2009005699 A1 | | 1/2009 |
| WO | 2010026654 A1 | | 3/2010 |
| WO | 2010042354 A1 | | 4/2010 |
| WO | 2010042732 A2 | | 4/2010 |
| WO | 2011005266 A1 | | 1/2011 |
| WO | 2011008654 A1 | | 1/2011 |
| WO | 2011133138 A1 | | 10/2011 |

OTHER PUBLICATIONS

International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
Notice of Allowance dated Dec. 16, 2014 for U.S. Appl. No. 12/835,704, 47 pages.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Japanese Office Action and English Translation for Japanese Patent Application No. 2011-153349 mailed Feb. 24, 2015, 9 pages.
Japanese Office Action and English Translation for Japanese Patent Application No. 2011-153349 mailed Mar. 24, 2015, 9 pages.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feburary 9, 2015, 11 pages.
Japanese Search Report (English Translation) for Japanese Application No. 2014-513700 dated Jan. 14, 2016, 25 pages.
Jian Hu., et al., "Area-Dependent Switching in Thin Film-Silicon Devices," Materials Research Society Symposium Proceedings, 2003, vol. 762, pp. A 18.3.1-A 18.3.6.
Jian Hu., et al., "Switching and Filament Formation in hot-wire Cvd p-type a-Si:H devices," Thin Solid Films, Science Direct, 2003, vol. 430, pp. 249-252.
Jo S.H., et al., "A Silicon-Based Crossbar Ultra-High-Density Non-Volatile Memory", SSEL Annual Report, 2007, 1 page.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H. et al., "High-Density Crossbar Arrays Based on a Si Memristive System", Supporting Information, 2009, pp. 1-4.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008, 4 pages.
Jo S.H., et al., "Nanoscale Memristive Devices for Memory and Logic Applications", Ph. D Dissertation, University of Michigan, 2010, 153 pages.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997, 6 pages.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, 2009, pp. 1-4.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005, 4 pages.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile Pram", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17 International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008, 5 pages.

(56) References Cited

OTHER PUBLICATIONS

Marand, "Materials Engineering Science," MESc. 5025 Lecture Notes: Chapter 7. Diffusion, University of Vermont. Retrieved from the Internet on Aug. 8, 2016, 15 pages.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 19, 2014 for U.S. Appl. No. 13/529,985, 9 pgs.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance mailed Jun. 19, 2012 for U.S. Appl. No. 12/861,650, 7 pages.
Notice of Allowance for U.S Appl. No. 14/509,967 dated Feb. 17, 2016, 18 pages.
Notice of Allowance for U.S Appl. No. 14/509,967 dated Jun. 16, 2016, 96 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 4, 2014 for U.S. Appl. No. 13/761,132, 6 pages.
Notice of Allowance mailed Oct. 5, 2011 for U.S. Appl. No. 12/940,920, 8 pages.
Notice of Allowance mailed Feb. 6, 2012 for U.S. Appl. No. 12/835,699, 7 pages.
Notice of Allowance mailed Feb. 6, 2013 for U.S. Appl. No. 13/118,258, 9 pages.
Notice of Allowance mailed Aug. 8, 2013 for U.S. Appl. No. 13/733,828, 9 pages.
Notice of Allowance mailed Jan. 8, 2013 for U.S. Appl. No. 12/814,410, 8 pages.
Notice of Allowance mailed Oct. 8, 2013 for U.S. Appl. No. 13/769,152, 9 pages.
Notice of Allowance mailed Oct. 8, 2013 for U.S. Appl. No. 13/905,074, 10 pages.
Notice of Allowance mailed Apr. 9, 2013 for U.S. Appl. No. 13/748,490, 8 pages.
Notice of Allowance mailed Sep. 9, 2014 for U.S. Appl. No. 13/620,012, 2 pages.
Notice of Allowance mailed Sep. 9, 2014 for U.S. Appl. No. 13/870,919, 5 pages.
Notice of Allowance mailed Oct. 10, 2013 for U.S. Appl. No. 13/452,657, 10 pages.
Notice of Allowance mailed Jan. 11, 2013 for U.S. Appl. No. 12/894,087, 2 pages.
Notice of Allowance mailed May 11, 2012 for U.S. Appl. No. 12/939,824, 8 pages.
Notice of Allowance mailed Jan. 11, 2016 for U.S. Appl. No. 14/613,299, 12 pages.
Notice of Allowance mailed Mar. 12, 2012 for U.S. Appl. No. 12/913,719, 5 pages.
Notice of Allowance mailed Jan. 20, 2016 for U.S. Appl. No. 14/034,390, 21 pages.
Notice of Allowance mailed Nov. 13, 2013 for U.S. Appl. No. 13/461,725, 10 pages.
Notice of Allowance mailed Nov. 14, 2012 for U.S. Appl. No. 12/861,666, 5 pages.
Notice of Allowance mailed Nov. 14, 2012 for U.S. Appl. No. 13/532,019, 8 pages.
Notice of Allowance mailed Mar. 15, 2013 for U.S. Appl. No. 12/894,098, 12 pages.
Notice of Allowance mailed Jan. 16, 2014 for U.S. Appl. No. 13/921,157, 23 pages.
Notice of Allowance mailed Oct. 16, 2013 for U.S. Appl. No. 13/174,264, 7 pages.
Notice of Allowance mailed Apr. 17, 2012 for U.S. Appl. No. 13/158,231, 7 pages.
Notice of Allowance mailed Jan. 17, 2014 for U.S. Appl. No. 13/725,331, 8 pages.
Notice of Allowance mailed Mar. 17, 2014 for U.S. Appl. No. 13/592,224, 8 pages.
Notice of Allowance mailed May 17, 2013 for U.S. Appl. No. 13/290,024, 6 pages.
Notice of Allowance mailed Sep. 17, 2013 for U.S. Appl. No. 13/679,976, 8 pages.
Notice of Allowance mailed Sep. 17, 2014 for U.S. Appl. No. 13/960,735, 9 pages.
Notice of Allowance mailed Sep. 17, 2014 for U.S. Appl. No. 13/462,653, 7 pages.
Notice of Allowance mailed Sep. 18, 2012 for U.S. Appl. No. 12/900,232, 8 pages.
Notice of Allowance mailed Sep. 18, 2014 for U.S. Appl. No. 13/920,021, 8 pages.
Notice of Allowance mailed Sep. 18, 2014 for U.S. Appl. No. 13/586,815, 9 pages.
Office Action for U.S. Appl. No. 14/613,301 dated Mar. 31, 2015, 58 pages.
Notice of Allowance mailed Apr. 2, 2013 for U.S. Appl. No. 13/149,757, 16 pages.
Notice of Allowance mailed Feb. 20, 2014 for U.S. Appl. No. 13/468,201, 10 pages.
Notice of Allowance mailed Mar. 20, 2014 for U.S. Appl. No. 13/598,550, 8 pages.
Notice of Allowance mailed Mar. 20, 2014 for U.S. Appl. No. 13/461,725, 2 pages.
Notice of Allowance mailed Oct. 21, 2011 for U.S. Appl. No. 12/582,086, 8 pages.
Notice of Allowance mailed Oct. 21, 2014 for U.S. Appl. No. 13/426,869, 11 pages.
Notice of Allowance mailed Feb. 10, 2015 for U.S. Appl. No. 13/525,096, 22 pages.
Notice of Allowance mailed May 22, 2012 for U.S. Appl. No. 12/815,369, 10 pages.
Notice of Allowance mailed Dec. 23, 2015 for U.S. Appl. No. 14/573,770, 11 pages.
Notice of Allowance mailed Oct. 23, 2013 for U.S. Appl. No. 13/417,135, 11 pages.
Notice of Allowance mailed Jan. 24, 2013 for U.S. Appl. No. 13/314,513, 5 pages.
Notice of Allowance mailed Jul. 24, 2012 for U.S. Appl. No. 12/939,824, 5 pages.
Notice of Allowance mailed Oct. 25, 2012 for U.S. Appl. No. 12/894,087, 8 pages.
Notice of Allowance mailed Sep. 25, 2014 for U.S. Appl. No. 13/447,036, 11 pages.

(56) References Cited

OTHER PUBLICATIONS

Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.
Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Nov. 29, 2012 for U.S. Appl. No. 12/815,318, filed Jun. 14, 2010.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Oct. 8., 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for European Application No. 11005649.6 dated Dec. 1, 2014, 2 pages.
Office Action for European Application No. 11005649.6 dated Nov. 17, 2015, 5 pages.
Office Action for European Application No. EP11005207.3 dated Aug. 8, 2012, 4 pages.
Office Action for U.S Appl. No. 13/463,714 dated Dec. 7, 2012.
Office Action for U.S. Appl. No. 14/611,022 dated May 7, 2015, 13 pages.
Office Action for U.S. Appl. No. 14/613,301 dated Jul. 31, 2015, 26 pages.
Office Action for U.S. Appl. No. 13/952,467 dated Jan. 15, 2016, 22 pages.
Office Action for U.S Appl. No. 14/194,499 dated May 18, 2016, 10 pages.
Office Action for U.S Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/613,301 dated Feb. 4, 2016, 42 pages.
Office Action for U.S. Appl. No. 14/887,050 dated Mar. 11, 2016, 12 pages.
Office Action for U.S. Appl. No. 15/046,172 dated Apr. 20, 2016, 8 pages.
Office Action mailed Apr. 1, 2013 for U.S. Appl. No. 13/174,077, filed Jun. 30, 2011.
Office Action mailed Aug. 1, 2012 for U.S. Appl. No. 12/894,098, filed Sep. 29, 2010.
Office Action mailed Mar. 1, 2012 for U.S. Appl. No. 12/835,704, filed Jul. 13, 2010.
Office Action mailed Aug. 2, 2013 for U.S. Appl. No. 13/594,665, filed Aug. 24, 2012.
Office Action mailed Sep. 2, 2014 for U.S. Appl. No. 13/705,082, 41 pages.
Office Action mailed Apr. 3, 2014 for U.S. Appl. No. 13/870,919, filed Apr. 25, 2013.
Office Action mailed Oct. 3, 2013 for U.S. Appl. No. 13/921,157, filed Jun. 18, 2013.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Feb. 17, 2011 for U.S. Appl. No. 12/913,719, filed Oct. 27, 2010.
Office Action mailed Dec. 6, 2013 for U.S. Appl. No. 13/564,639, filed Aug. 1, 2012.
Office Action mailed Jun. 17, 2014 for U.S. Appl. No. 14/072,657, filed Nov. 5, 2013.
Office Action mailed Feb. 6, 2014 for U.S. Appl. No. 13/434,567, filed Mar. 29, 2012.
Office Action mailed Mar. 2, 013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S Appl. No. 13/436,714, filed Mar. 30, 2012.
Office Action mailed Mar. 7, 2013 for U.S. Appl. No. 13/651,169, filed Oct. 12, 2012.
Office Action mailed Mar. 17, 2015 for U.S. Appl. No. 14/573,770.
Office Action mailed Aug. 8, 2012 for EP Application No. EP11005207 filed Jun. 27, 2011.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed Oct. 19, 2007.
Office Action mailed Aug. 9, 2013 for U.S. Appl. No. 13/764,710, filed Feb. 11, 2013.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941, filed Mar. 31, 2011.
Office Action mailed Mar. 12, 2014 for U.S. Appl. No. 13/167,920, filed Jun. 24, 2011.
Office Action mailed Sep. 12, 2014 for U.S. Appl. No. 13/426,869, filed Mar. 22, 2012.
Office Action mailed Sep. 12, 2014 for U.S. Appl. No. 13/756,498.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action mailed Mar. 14, 2012 for U.S. Appl. No. 12/815,369, filed Jun. 14, 2010.

(56) References Cited

OTHER PUBLICATIONS

Office Action mailed Mar. 14, 2014 for U.S. Appl. No. 12/835,704, filed Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed May 16, 2012 for U.S. Appl. No. 12/815,318, filed Jun. 14, 2010.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Apr. 18, 2016 for U.S. Appl. No. 14/573,770.
Office Action mailed Apr. 19, 2011 for U.S. Appl. No. 12/582,086, filed Oct. 20, 2009.
Sune J., et al., "Nondestructive Multiple Breakdown Events in Very Thin Si02 Films," Applied Physics Letters, 1989, vol. 55, pp. 128-130.
Office Action mailed Jun. 19, 2012 for U.S. Appl. No. 13/149,757, filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036, filed Apr. 13, 2012.
Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Terabe K., et al., "Quantized Conductance Atomic Switch," Nature, 2005, vol. 433, pp. 47-50.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.
Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S Appl. No. 13/156,232.
Office Action mailed Aug. 27, 2013 for U.S. Appl. No. 13/436,714, filed Mar. 30, 2012.
Office Action mailed Dec. 27, 2013 for U.S. Appl. No. 13/525,096, filed Jun. 15, 2012.
Office Action mailed Mar. 27, 2012 for U.S. Appl. No. 13/314,513, filed Dec. 8, 2011.
Office Action mailed Feb. 28, 2014 for U.S. Appl. No. 12/625,817, filed Nov. 25, 2009.
Office Action mailed Jan. 29, 2014 for U.S. Appl. No. 13/586,815, filed Aug. 15, 2012.
Office Action mailed Jul. 29, 2013 for U.S. Appll. No. 13/466,008, filed May 7, 2012.
Office Action mailed Mar. 29, 2013 for U.S. Appl.No. 12/861,432, filed Aug. 23, 2010.
Office Action mailed Jul. 30, 2012 for U.S. Appl. No. 12/900,232, filed Oct. 7, 2010.
Office Action mailed Jun. 30, 2014 for U.S. Appl. No. 13/531,449, filed Jun. 22, 2012.
Office Action mailed Mar. 30, 2011 for U.S. Appl. No. 11/875,541, filed Oct. 19, 2007.
Office Action mailed Sep. 30, 2013 for U.S. Appl. No. 13/189,401, filed Jul. 22, 2011.
Office Action mailed Sep. 30, 2013 for U.S. Appl. No. 13/462,653, filed May 2, 2012.
Office Action mailed Apr. 6, 2015 for U.S. Appl. No. 14/034,390.
Office Action mailed May 20, 2016 for U.S. Appl. No. 14/613,299.
Office Action mailed Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 330-833.
Owen A.E., et al., "Memory Switching in Amorphous Silicon Devices," Journal of Non- Crystalline Solids, 1983, vol. 50-60 (P1.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, p. 31 Retrieved from the Internet.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Waser R., et al., "Nanoionics-based Resistive Switching Memories," Nature Materials, 2007, vol. 6, pp. 833-835.
Nritten Opinion for Application No. PCT/US2009/060023, mailed on May 18, 2010, 3 pages.
Written Opinion for Application No. PCT/US2009/061249, mailed on May 19, 2010, 3 pages.
Written Opinion for Application No. PCT/US2011/040090, mailed on Feb. 17, 2012, 6 pages.
Written Opinion for Application No. PCT/US2011/045124, mailed on May 29, 2012, 5 pages.
Written Opinion for Application No. PCT/US2011/046036, mailed on Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Yuan H.C., et al., "Silicon Solar Cells with Front Hetero-Contact and Aluminum Alloy Back Junction", NREL conference Paper CP-520-42566, 33rd IEEE Photovoltaic Specialists Conference, May 11-16, 2008, National Renewable Energy Laboratory, San Diego, California.
Zankovych S., et al., "Nanoimprint Lithography: Challenges and Prospects," Nanotechnology, 2001, vol. 12, pp. 1-95.
Notice of Allowance for U.S. Appl. No. 14/588,202 dated Jan. 20, 2016, 15 pages.

(56) References Cited

OTHER PUBLICATIONS

Office Action for U.S Appl. No. 14/588,202 dated Sep. 11, 2015, 9 pages.
Office Action for U.S. Appl. No. 14/588,202 dated May 10, 2016, 8 pages.
International Search Report and Written Opinion for Application No. PCT/US2012/040232, mailed on Feb. 26, 2013, 7 pages.
Final Office Action for U.S. Appl. No. 14/612,025 dated Jun. 14, 2016, 7 pages.
Office Action for U.S Appl. No. 14/612,025 dated Feb. 1, 2016, 12 pages.
Office Action mailed Dec. 6, 2013 for U.S. Appl. No. 13/960,735, filed Aug. 6, 2013.
Notice of Allowance for U.S. Appl. No. 14/612,025 dated Jul. 22, 2015, 25 pages.
Office Action mailed May 23, 2013 for U.S. Appl. No. 13/592,224, filed Aug. 22, 2012.
Advisory Action mailed Jun. 8, 2012 for U.S. Appl. No. 12/835,704, 3 pages.
Avila A., et al., "Switching in Coplanar Amorphous Hydrogenated Silicon Devices," Solid-State Electronics, 2000, vol. 14 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 5 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, 5 pages.
Corrected Notice of Allowance mailed Jan. 11, 2013 for U.S. Appl. No. 12/861,666, 8 pages.
Dehon A., "Array-Based Architecture for Fet-Based, Nanoscale Electronics," IEEE Transactions on Nanotechnology, 2003, vol. 2 (1), pp. 23-32.

Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 312-813.
Dey S.K., "Electrothermal Model of Switching in Amorphous Silicon Films," Journal of Vacuum Science & Technology, 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Search Report dated Apr. 12, 2012 for Eurpopean Application No. EP09819890.6, 6 pages.
European Search Report for Application No. EP11005207.3 mailed on Oct. 26, 2011, 5 pages.
European Search Report for Application No. EP14000949, mailed on Jun. 4, 2014, 7 pages.
European Search Report for European Application No. EP11005649 mailed Oct. 15, 2014, 2 pages.
Ex parte Quayle Action mailed May 8, 2012 for U.S. Appl. No. 12/826,653, 8 pages.
Final Office Action dated Jun. 29, 2016 for U.S. Appl. No. 14/692,677, 21 pages.
International Search Report and Written Opinion for Application No. PCT/US20121040242, mailed on Jan. 31, 2013, 9 pages.
Final Office Action mailed Feb. 1, 2016 for U.S. Appl. No. 14/573,817, 12 pages.
Final Office Action mailed May 20, 2016 for U.S. Appl. No. 14/253,796, 20 pages.
Final Office Action mailed Aug. 13, 2014 for U.S. Appl. No. 13/525,096, 24 pages.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, Mrs Bulletin, Nov. 2004, pp. 805-813. Retrieved from the Internet.
Hajto J., et al., "Amorphous & Microcrystalline Semiconductor Devices: Materials and Device Physics", Artech House Publishers, Mar. 1, 2004, vol. 2, pp. 640-700.
Hajto J., et al., "Analogue Memory and Ballistic Electron Effects in Metal-amorphous Silicon Structures," Philosophical Magazine, 1991, vol. 63 (1), pp. 349-369.
Hajto J., et al., "Electronic Switching in Amorphous-Semiconductor Thin Films", Chapter 14, 1992, pp. 640-701.
Hajto J., et al., "The Programmability of Amorphous Silicon Analogue Memory Elements," Materials Research Society Symposium Proceedings, 1990, vol. 192, pp. 405-410.
Holmes A.J., et al., "Design of Analogue Synapse Circuits using Non-Volatile a-Si:H Memory Devices", Proceedings of IEEE International Symposium on Circuits and System, 1994, pp. 351-354, vol. 6.
Hu J., et al., "AC Characteristics of Cr/p. sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504—20090406, May 4, 2009, pp. 1-9.
Hudgens S., et al., "Overview of Phase-Change Chalcogenide Nonvolatile Memory Technology", MRS Bulletin, Nov. 2004, pp. 829-832. Retrieved from the Internet.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).

* cited by examiner

NON-VOLATILE MEMORY WITH OVERWRITE CAPABILITY AND LOW WRITE AMPLIFICATION

CROSS-REFERENCE TO RELATED APPLICATION(S)

This subject application for patent claims priority to and is a non-provisional of U.S. Provisional Patent Application No. 61/785,979, filed Mar. 14, 2013, and U.S. Provisional Patent Application No. 61/712,171, filed Oct. 10, 2012, which are incorporated by reference herein in their entirety and for all purposes.

TECHNICAL FIELD

The subject disclosure relates generally to non-volatile memory, and as one illustrative example, a non-volatile memory architecture that facilitates write and overwrite with low write amplification.

BACKGROUND

A recent innovation within the field of integrated circuit technology is resistive-switching memory. While much of resistive-switching memory technology is in the development stage, various technological concepts for resistive-switching memory have been demonstrated by the assignee of the present invention and are in one or more stages of verification to prove or disprove associated theory (ies). Even so, resistive-switching memory technology promises to hold substantial advantages over competing technologies in the semiconductor electronics industry.

Resistive random access memory (RRAM) is one type of resistive memory. The inventor believes RRAM has the potential to be a high density non-volatile information storage technology for higher density semiconductor-based devices. Generally, RRAM stores information by controllably switching among distinct resistive states. One theoretical example of an RRAM device includes an insulator layer provided between a pair of electrodes. Such a device properly configured can exhibit electrical pulse-induced hysteretic resistance switching effects.

Resistance switching is explained (in some theories) as a result of formation of a conductive structure within an otherwise electrically insulating medium. The conductive structure could be formed from ions in a nearby electrode, for instance, having free ions. In some theories, field-assisted diffusion of ions can occur in response to a suitable electric potential or current applied to an RRAM memory cell. According to other theories, filament formation can occur in response to joule heating and electrochemical processes in binary oxides (e.g., NiO, $TiO_2$, or the like), or by a redox process for ionic conductors including oxides, chalcogenides, polymers, and so on.

The inventors expect resistive devices based on an electrode, insulator, electrode model, including those formed on polysilicon to exhibit good endurance and life cycle. Further, the inventors expect such devices to have very high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile FLASH MOS devices.

In light of the above the inventors desire to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments disclosed herein provide a non-volatile memory architecture having write and overwrite capabilities providing low write amplification for a memory storage system. In some disclosed embodiments, the write amplification can be two or below. In at least one embodiment, the write amplification can be as low as one.

In further embodiments, there is provided a non-volatile memory array having write and overwrite capabilities with high memory cell granularity. The non-volatile memory array can, for instance, write to a group of memory cells as small as a word (e.g., two bytes, or four bytes in a double word, eight bytes in a quadruple word, or the like, depending for instance on programmed operational logic or constraints). In one embodiment(s), the non-volatile memory can write to a group of memory cells as small as a byte. In at least one additional embodiment(s), the non-volatile memory can write to a single memory cell.

Further to the above, various disclosed embodiments include overwrite capabilities providing low write amplification (e.g., no write amplification) to a memory storage system. Overwrite capabilities include a program process that directly changes information stored in one or more addressed memory cells without erasing the page or the block containing the addressed memory cells. Directly changing information refers to a program process that is implemented without (or with reduced) garbage collection, wear leveling, memory location mapping, or other processes that accomplish an overwrite indirectly, by transferring data from a first memory location to a second memory location, instead of changing or refreshing the information stored in the first memory location. Write amplification for the overwrite can be as low as one, in some embodiments, whereas in other embodiments the write amplification can be higher than one where one or more additional functions (e.g., garbage collection, wear leveling, memory location mapping, etc.) are implemented in conjunction with the overwrite. The overwrite capability provides memory storage systems with low write amplification and a corresponding system performance increase. This is accomplished by avoiding use of duplicated revision data in the memory storage at different locations; instead data is revised in its original address location. By overwriting an original address location, conventional algorithms such as garbage collection, wear leveling, memory location mapping, etc., that increase write amplification can be significantly reduced or eliminated.

In additional embodiments, non-volatile memory systems having low write amplification can comprise two-terminal memory cell arrays. In some embodiments, the two-terminal memory can include resistive memory, such as a resistive-switching memory technology. In one or more further aspects, the non-volatile memory can comprise one or more arrays of resistive random access memory (RRAM).

In still other embodiments, non-volatile memory systems having low write amplification, sub-20 nanometer (nm) resistive cell technology, can be implemented as a digital storage drive. The digital storage drive can be removably connected to a host computing device in some aspects, and can operate in a similar fashion as a FLASH drive in alternative or additional aspects. For instance, the non-volatile memory can be arranged schematically in a NAND or NOR logical array (though other logical arrays known in the art or made known to one of skill in the art by way of the context described herein is considered within the scope of the subject disclosure), while equaling or exceeding write, erase and read performance of either NAND or NOR FLASH memory.

In at least one embodiment, disclosed is a storage device comprising non-volatile two-terminal resistive-switching memory. The storage device can be a sub-20 nm technology having write amplification of one. In at least one embodiment, the storage device can comprise multiple arrays of the two-terminal resistive switching memory, stacked in a three-dimensional arrangement. The storage device can operate on, including overwrite, large numbers of memory cells concurrently (e.g., a page, a block, etc.), or can operate on small numbers of memory cells (e.g., a word, a byte, or set of bits, or even a single bit), or both on large and small numbers. Accordingly, the storage device can comprise extraordinary flexibility for memory processes, achieving high write and erase performance, as well as fast, targeted overwrite or refresh performance.

In further embodiments, a disclosed digital storage device can have a cell write speed between about five nanoseconds (ns) and about five microseconds (µs). In still other embodiments, the disclosed digital storage device can have a cell read speed between about thirty ns and about one µs. In alternative or additional aspects, the disclosed storage device can comprise a page erase and overwrite capability, a word erase and overwrite capability, a byte erase or overwrite capability, or a bit erase or overwrite capability. In at least one disclosed aspect, the write amplification of the erase/overwrite capability can be as small as one.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
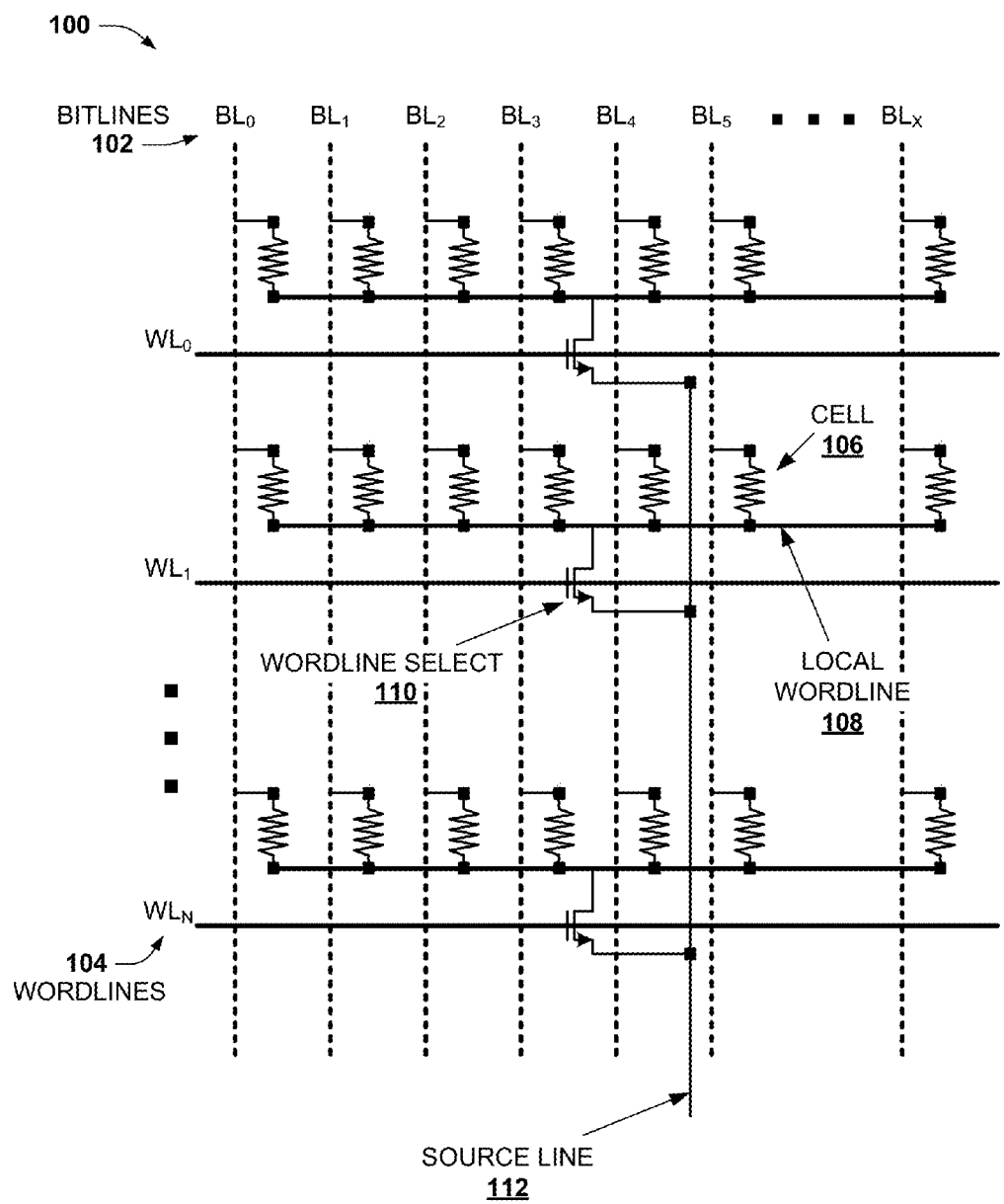
FIG. 1 illustrates a schematic diagram of an example memory circuit having high component density supporting low write amplification (WA) in disclosed aspects.

This disclosure relates to two-terminal memory cells employed for digital information storage. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe . . . ), a resistive switching layer (RSL) and an active metal layer for providing filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide, and so forth.

Examples of the active metal layer can include, among others: silver (Ag), gold (Au), titanium (Ti), nickel (Ni), aluminum (Al), chromium (Cr), tantalum(Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

The subject disclosure provides for two-terminal memory structures having high component density and low write amplification (WA). In some aspects, the two-terminal memory can comprise 20 nanometer (nm) technology, whereas in other aspects the two-terminal memory can comprise sub-20 nanometer (nm) technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on.

In additional embodiments disclosed herein, there is provided a digital storage device comprising two-terminal memory. In some embodiments, such a digital storage device can be removably connected to a computing device (e.g., a host computer). In other embodiments, the digital storage device can be integrated with the computing device (e.g., read only memory, random access memory, etc.). In particular embodiments, the digital storage device can be a FLASH drive that can be connected to a host computer over a memory interface (e.g., a host interface such as a universal serial bus [USB], or other suitable interface; see, e.g., FIGS. 10 and 11, infra) and can store and retrieve information, and erase stored information, in response to commands by the host device.

The inventors of the subject disclosure view FLASH memory technology as having two primary distinct logical architectures, the NAND and the NOR architecture, both based on different arrangements of semiconductor transistors. Each of the logical architectures has different attributes, including advantages and drawbacks, with respect to the other. NAND is the most commonly used in consumer FLASH drive applications, however, largely because of its memory density and low cost.

NAND FLASH is employed for compact FLASH devices, USB devices, SD cards, solid state drives (SSDs), and storage class memory, as well as other form-factors. NAND has proven a successful technology in fueling the drive to scale down to smaller devices and higher chip densities over the past decade. However, as technology scaled down past 72 nanometer (nm) memory cell technology, the inventors of the present application believe that several structural and electrical problems became evident. For instance, bit error rates (BERs) increased significantly, while memory cycling (related to memory endurance) decreased.

In addition to problems associated with scaling to smaller technologies, FLASH has some inherent drawbacks as well. One limitation of NAND FLASH technology is that a page of memory (e.g., memory cells connected to a single global wordline of a memory device, e.g., four kilobits [kB]) cannot be directly altered or rewritten without processing an entire block of the memory (e.g., two megabits [MB]). Furthermore, multiple block-processes are involved in rewriting the page of memory. As an example, altering a page of memory can involve backing up the block in which the page of memory resides, erasing the block, and writing the backed-up data—including revisions to the page of memory—back to the block. As this example illustrates, NAND FLASH cannot be updated without first being erased, regardless of memory granularity (e.g., block, page, word, byte, bit, etc.).

To continue the above page overwrite example, reducing P/E cycles for the block of memory can involve writing the backed-up data with revisions to the page of memory to a second block of memory, other than the block in which the page resides. While this involves writing to two blocks of memory, it removes the erase process to the first block, reducing overall memory operations involved in overwriting the page of memory from two block operations (e.g., erasing the block, re-writing the block), to one block operation (e.g., writing to the second block). In this case, a logical to physical (L2P) mapping table is maintained and updated by a memory controller to keep track of the new location of the backed-up data with revisions. The L2P increases controller overhead, including memory and processes.

In addition to the foregoing, NAND FLASH does not generally have a high program/erase (P/E) cycle count before degradation. As a result, NAND devices often incorporate wear leveling schemes to reduce P/E cycles for a given block(s) of memory, or spread the P/E cycles among most or all blocks of a memory device. The wear-leveling algorithm attempts to equalize a number of P/E cycles across respective blocks of memory for a NAND device. This can be implemented independent of host operating commands and file system operations. An efficient wear-leveling algorithm attempts to maintain a low P/E cycle differential between the highest cycled block of memory and the lowest cycled block of memory. While improving product life time, the wear-leveling algorithm also adds computational and management overhead.

In addition to the overhead added by wear-leveling algorithms and L2P mapping, garbage collection algorithms are commonly employed with NAND devices, particularly for smaller technology nodes that have lower endurance (e.g., P/E cycle capacity) wear leveling and garbage collection algorithms are essential to increase the perceived endurance cycles. Re-writing pages or blocks of data to other locations on a chip leaves the original location with residual data. After many rewrites, whether due to host commands or wear-leveling, a significant number of blocks or pages of memory can be left with residual data. Because many NAND FLASH devices cannot overwrite memory cells without first erasing them, the garbage collection algorithms are designed to free up these pages or blocks of data by erasing them, so that new data can be written to them.

For NAND FLASH, an overwrite process, as well as garbage collection and wear-leveling, often involve multiple P/E cycles. The number of P/E cycles is related to a memory characteristic called write amplification (WA). WA can be viewed as a measure of efficiency of a memory controller, and is generally defined by characteristics of a memory device and of a memory controller associated with the memory device. More particularly, WA refers to a number of memory controller write processes involved in executing a single host write command to the memory. An ideal WA is one, which indicates a single memory controller write process for each host write command. NAND FLASH often has a WA between three and four, however, reflecting the lack of direct overwrite capability. Because memory reliability and life are affected by increasing P/E cycles, the WA of a memory device directly affects reliability and performance of a memory device.

Yet another factor impacting storage system performance and overhead is decreasing memory cell retention, and corresponding increase in BER. As mentioned above, as semiconductor transistor technology has decreased in size (e.g., from 72 nm nodes to 20 nm nodes) there has been a correlated decrease in memory retention and increase in BER. The increased BER places further demand on error correction code (ECC) requirements for NAND FLASH. This increase in ECC demand results in an increasing number of ECC corrections for a given size memory (e.g., 1 kB), which correlates to an increase in a number of chip transistors, process cycles and power consumption associated with ECC. Further exacerbating this problem is the incorporation of more powerful digital signal processing algorithms (e.g., low density parity check codes [LPDC]) with traditional ECC algorithms. These codes can increase effectiveness of ECC corrections, but significantly adds overhead and power consumption to all the components of the storage memory system. The inventors of the subject disclosure are of the opinion that the memory device requires more spare memory to accommodate the increased ECC demand, the controller requires more transistors, and the system requires larger capacity DRAM elements.

In addition to the memory retention, device longevity and system overhead challenges discussed above, NAND FLASH storage systems have inherent slow page read speeds. A typical read speed for many NAND FLASH products is about 25 μs. This latency may not be suitable for newer applications, such as enterprise storage, real-time embedded memory applications, or the like. For instance, in these and other memory applications, sub-100 ns read access times are preferred. The relatively low read current of NAND FLASH (e.g., less than about 300 nanoamps [nA]) poses a problem for improving read times of this technology. Moreover, the memory architecture of NAND FLASH incorporates some inherent challenges to fast random read operation.

NAND FLASH has been a dominant technology in portable memory storage devices over recent years. The ability to effectively scale in node size, in conjunction with fast write and erase speeds, fairly good longevity and manufacturing has made NAND FLASH the most popular removable storage device in commercial and consumer markets. Though NAND has met the demand for scalability for up to 20× technologies, the inventors of the subject application believe that other technologies will begin to replace conventional gate-operated transistors employed for memory applications, particularly at and below the 20 nm cell technology.

To this and related ends, the subject disclosure provides a memory array comprising memory cells formed of a two-terminal memory technology. Examples of the two-terminal memory technology include resistive memory (e.g., resistive-switching memory cell), ferromagnetic memory, phase change memory, magneto-resistive memory, organic memory, conductive bridging memory, and so on. Further, the two-terminal memory technology can facilitate writing to and rewriting to a memory location without first erasing a block of memory in which the memory location resides. In some aspects of the subject disclosure, disclosed memory devices can write to the memory location without first erasing the memory location itself. Accordingly, such memory devices can avoid garbage collection algorithms and the associated overhead costs. In addition, these memory devices provide WA value as low as one, the ideal WA value for storage systems.

In additional embodiments, disclosed are memory devices comprising two-terminal memory arrays having fast read (e.g., page read) characteristics. In at least one embodiment, a read speed of memory cells employed for the disclosed memory devices can be about 30 ns to about 1 μs. Furthermore, the memory devices can have low BER, high endurance and robust cycling characteristics, alleviating constraints on ECC and wear-leveling algorithms and reducing controller overhead and power consumption. In various embodiments, the two-terminal memory technology provided for the disclosed memory arrays can have a memory retention of about ten years or more (e.g., at 85 degrees Celsius), and cell endurance of about $1 \times 10e^8$ P/E cycles. In still other embodiments, the two-terminal memory technology can readily scale down to 5 nm nodes, though the subject disclosure is not limited to two-terminal memory technology having this scalability.

In one or more other embodiments, a disclosed memory array can be implemented in a three-dimensional stack arrangement. The three-dimensional stack arrangement can be comprised of multiple two-dimensional memory arrays (e.g., a two-dimensional NAND array, a two-dimensional NOR array, or the like), for instance. In at least one disclosed aspect, the three-dimensional stack arrangement can comprise a pair of two-dimensional memory arrays, stacked in a third dimension. In another aspect, the three-dimensional stack arrangement can comprise four two-dimensional memory arrays, stacked in the third dimension. In yet other aspects, other numbers of two-dimensional memory arrays (e.g., three, five, six, seven, and so on) can be stacked into the third dimension to provide the three-dimensional stack arrangement.

According to an additional embodiment(s), a memory device is disclosed having high write or overwrite granularity. Write or overwrite granularity, as utilized herein, refers to a minimum number of cells that can be programmed, re-programmed or refreshed with a single memory operation. High granularity refers to a lower minimum number of cells, whereas low granularity refers to a higher minimum number of cells. Further to the above, the high write or overwrite granularity can be accomplished at least in part by adding a program decoder configured as an input-output based (I/O-based) decoder. The I/O-based decoder can be configured to implement I/O-based memory operations (e.g., programming, erasing, overwriting, and so on) for a memory device. The I/O-based memory operations can facilitate a write or overwrite granularity of equal to or less than a page of memory. In some embodiments, the I/O-based decoder can facilitate a write or overwrite granularity of multiple words (e.g., a double-word, quad-word, etc.), or even a single word of data (e.g., one byte of data, several bits of data, etc.). In at least one embodiment, the I/O-based decoder can facilitate a write or overwrite granularity of a single bit of data (e.g., a single memory cell).

In at least one embodiment, the subject disclosure provides a solid state non-volatile memory storage drive that can be removably connected to and from a host computing device, and comprised of two-terminal memory cell technology. The two-terminal memory cell technology can include resistive-switching memory in some aspects (e.g., resistive random access memory, or the like). In one embodiment, the storage drive can have an 8 bit memory channel with 200 megabyte transfer rate, and between 1 and 8 devices per channel. Alternatively, or additionally, the storage drive can have one or more of the following features: a data transfer rate of about 100 megahertz, a bus width of 8 bits, a page size of about 4 kB, a shift time of about 20 μs, a shift time (e.g., shift time+25% OH) of about 25 μs, a program time of about 28 μs, a read latency of about 1 μs, a write amplification of 1, or a maximum transfer rate of about 160 megabytes.

Referring now to the drawings, FIG. 1 illustrates a schematic diagram of an example memory architecture 100 according to one or more aspects of the subject disclosure. Memory architecture 100 can be a subset of a memory array incorporated as part of a non-volatile, solid state memory storage device in some disclosed aspects. For example, memory architecture 100 can be a sub-block of a block of memory, where the sub-block comprises global wordlines of the block of memory, and a subset of bitlines of the block of memory that share a set of common local wordlines that are exclusive to the sub-block of the block of memory.

Memory architecture 100 can comprise a set of bitlines 102. Set of bitlines 102 comprises individual bitlines $BL_0$, $BL_1$, $BL_2$ ... $BL_X$, where X is a positive integer greater than one. Intersecting set of bitlines 102 is a set of wordlines 104. Set of wordlines 104 comprises individual wordlines $WL_0$, $WL_1$ ... $WL_N$, where N is a positive integer greater than one. In one embodiment, X can be an integer equal to 8 and N can be an integer equal to 512; however, the subject disclosure is not so limited and X and N can have other suitable values.

As mentioned above, set of bitlines 102 can be associated with a sub-block of a block of memory, such that set of bitlines 102 share a set of local wordlines 108 that are exclusive to the sub-block of the block of memory. Respective ones of the set of local wordlines 108 are connected to a group of memory cells 106. Memory cells 106 have a first terminal connected to one of set of bitlines 102, and a second terminal connected to one of set of local wordlines 108. Local wordlines 108 are connected to a source line 112 by respective wordline select transistors 110. Each wordline select transistor 110 is positioned to electrically connect (when activated, or in a conducting state) or electrically disconnect (when deactivated, or in a resistive state) respective ones of the local wordlines 108 with/from source line 112. Respective wordline select transistors 110 can be gated transistors (e.g., single gate, floating gate, and so on) in some embodiments. Respective gates of wordline select transistors 110 are connected to and controlled by respective ones of set of wordlines 104, as depicted.

Application of a suitable electrical signal to a selected one of bitlines 102 and a selected one of local wordlines 108 can facilitate performing memory operations on a target one(s) of memory cells 106. Applying the electrical signal to the selected one of local wordlines 108 can be implemented by source line 112 and an associated one of set of wordlines 104 (e.g., see FIG. 2, infra). Memory cell operations that can be implemented utilizing the circuitry of memory architecture 100 can comprise activating, deactivating, programming, re-programming, erasing, etc., the target memory cell(s) 106, by applying a suitable electric signal to one of bitlines 102 and one of local wordlines 108 connected to the target memory cell(s) 106 (see, e.g., FIG. 6, infra).

Figure 2:
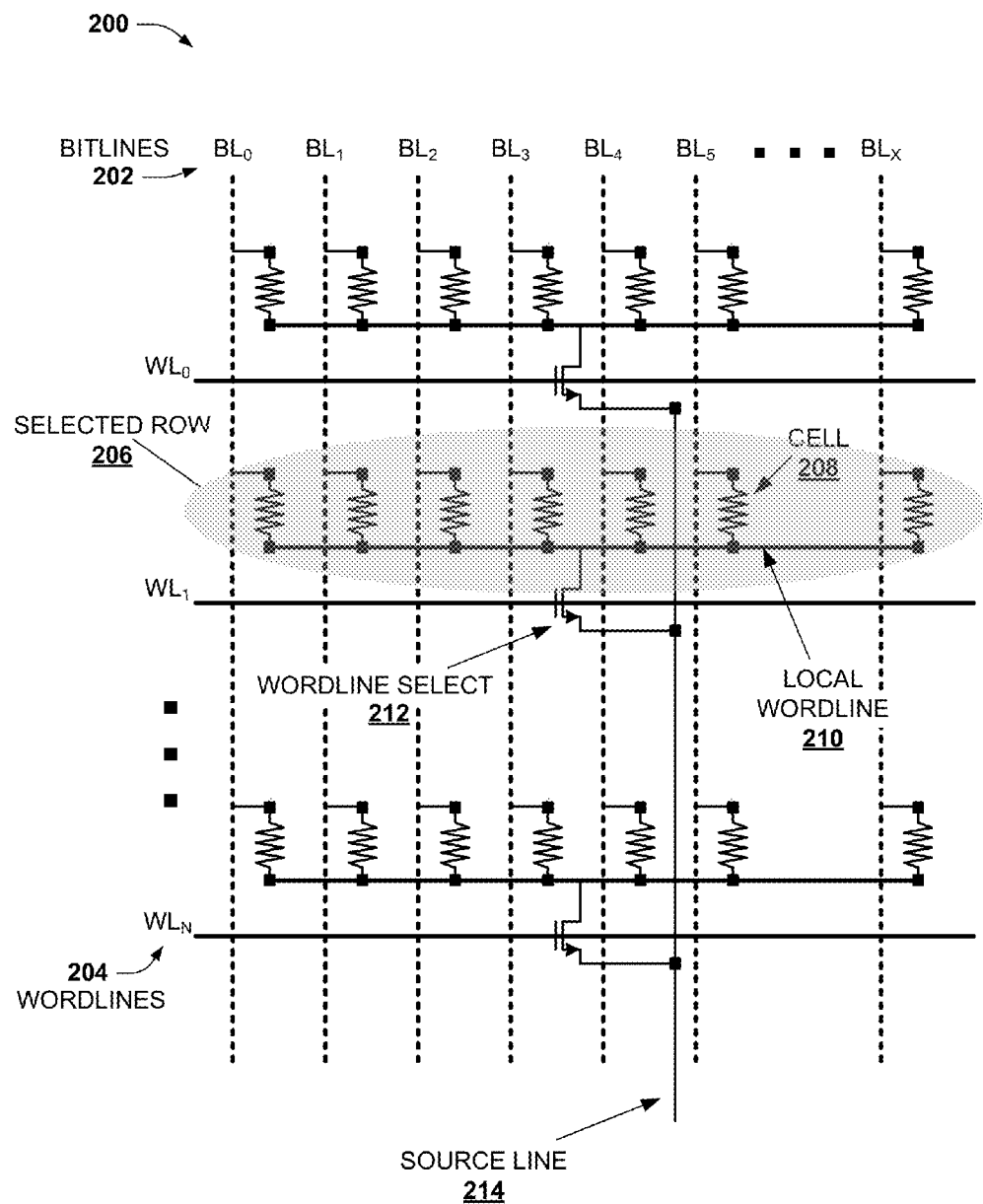
FIG. 2 depicts a schematic diagram of the example memory circuit of FIG. 1 comprising a row of memory selected for a memory operation, in some aspects.

FIG. 2 illustrates a schematic diagram of an example memory architecture 200 according to one or more embodiments of the subject disclosure. In at least one embodiment, memory architecture 200 can be substantially the same as memory architecture 100 of FIG. 1, supra. But the subject disclosure is not so limited; for instance, in another embodiment memory architecture 100 can be programmed, overwritten or erased according to a different memory operation process differently from memory architecture 200.

Memory architecture 200 can comprise bitlines 202 of a memory device, including bitlines $BL_0$ ... $BL_X$, and wordlines 204 of the memory device, including wordlines $WL_0$ ... $WL_N$, as shown schematically by FIG. 2. Memory architecture illustrates bitlines 202 and wordlines 204 in a perpendicular arrangement (e.g., in a two-dimensional crossbar array), though the subject disclosure is not limited to such an arrangement. In some embodiments, memory architecture 200 can be a part of a three-dimensional memory arrangement, in which multiple two-dimensional arrays (e.g., including memory architecture 200) of intersecting bitlines and wordlines are stacked in a third dimension.

Generally, memory architecture 200 comprises one memory cell 208 for each intersection of one of bitlines 202 and one of wordlines 204. However, respective memory cells 208 need not be physically located where a wordline 204 intersects a bitline 202. As depicted, a set of local wordlines 210 can be interspersed between respective wordlines 204. Respective groups of memory cells 208 can comprise those memory cells 208 that share a terminal contact at one of the local wordlines 210. For instance, the group of memory cells 208 associated with a selected row 206 can each have one terminal connected to the one of the local wordlines 210 associated with the selected row 206. Additionally, respective memory cells 208 in the group of memory cells 208 can have a second terminal that is connected to one of bitlines 202. In this manner, by activating a selected row 206, and applying an operation voltage at one of selected bitlines 202, a single memory cell 208 of a group of memory cells (e.g., memory cells 208 connected to the local wordline 210 on selected row 206) can be targeted for a memory operation (e.g., read, write, erase, overwrite, etc.).

A set of wordline select transistors 212 can be configured to electrically connect or electrically disconnect respective associated local wordlines 210 with a source line 214. An associated one of wordlines 204 can be connected to a gate of respective wordline select transistors 212. Thus, a suitable activation/deactivation signal applied at wordline $WL_1$ can activate or deactivate the local wordline 210 associated with selected row 206. When the wordline select transistor 212 connected to wordline 204 $WL_1$ is activated, then the local wordline 210 of selected row 206 and the terminals of the group of memory cells connected to this local wordline 210 are electrically connected to source line 214. This process enables selection of selected row 206. For example, applying an activation signal to wordline 204 $WL_1$ connects the local wordline of selected row 206 to source line 214. Then, by applying a suitable signal to a selected bitline 202 and source line 214, the signal is observed by a memory cell 208 of selected row 206 having a first contact on the selected bitline 202.

Figure 3:
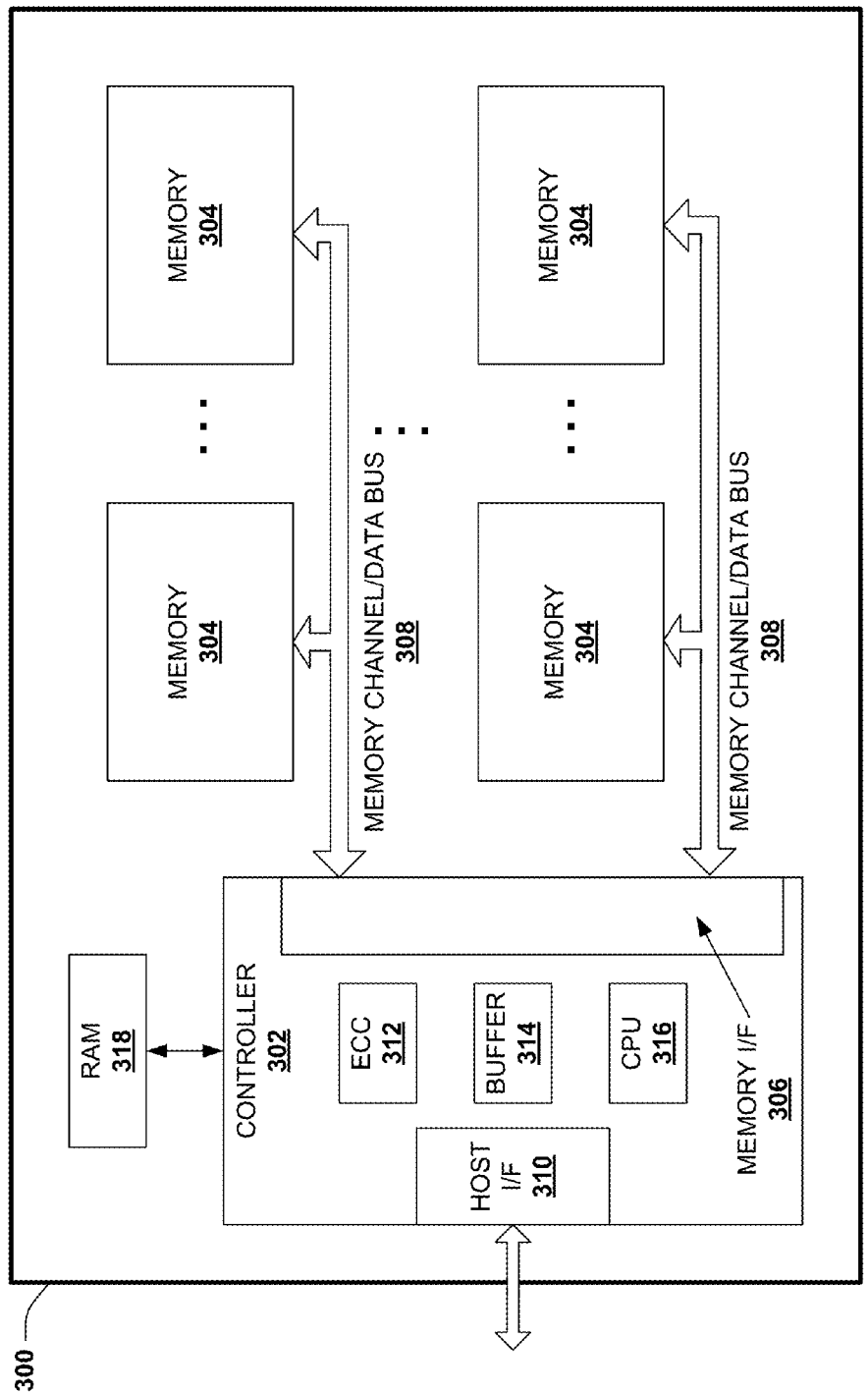
FIG. 3 depicts a block diagram of an example electronic memory system having real-time read and write capability with low WA, in one or more embodiments.

FIG. 3 depicts a block diagram of an example memory device 300 according to one or more disclosed embodiments of the subject disclosure. In some embodiments, memory device 300 can be a removable storage device, such as a FLASH device, which can be connected to or disconnected from a host computing device (e.g., a computer, a laptop, a terminal, a smart phone, a table computer, etc.) by way of a communication interface (e.g., a universal serial bus [USB] interface, and so forth). In other embodiments, memory device 300 can be deployed on a hardware card for connecting with a server device or other computing device. In still other embodiments, memory device 300 can be a stand-alone device configured to communicate with a remote host device via a suitable remote communication platform (e.g., a wireless interface, a cellular interface, a satellite interface, a wired interface, an Ethernet interface, a broadband over power line interface, or the like, or a suitable combination thereof).

In various embodiments, memory device 300 can be operable to electronically communicate with the host computing device over a suitable communication interface. In at least one embodiment, memory device 300 can include a power source; however in another embodiment, memory device 300 can be powered via the communication interface. In at least one alternative embodiment, memory device 300 can include the power source, and also acquire power via the communication interface. In still other embodiments, memory device 300 can be integrated within a computing device, or can operate exclusive of a host computing device. One of skill in the art will appreciate other suitable configurations for memory device 300, which are considered within the scope of the subject disclosure. To this end, memory device 300 can include additional components other than those depicted by FIG. 3, as suitable (e.g., including a multi-purpose processing component, including applications configured to operate with the multi-purpose processing component utilizing data stored on memory device 300, and so on).

Memory device 300 can comprise a memory controller 302. Memory controller 302 can be configured to communicate with a host computing device over a host interface 310. Host interface 310 can operate to receive host commands from the host computing device related to memory modules 304 on memory device 300. Suitable host commands can include a write command, a read command, an erase command, an overwrite command, or the like, or suitable combinations thereof. Additionally, host interface 310 can be configured to receive data from the host computing device related to a host command, or provide data stored on one or more memory modules 304 to the host device in response to a host command.

In various embodiments, memory controller 302 can further comprise a memory interface 306 configured to communicate with and execute memory operations in conjunction with memory modules 304 over one or more memory channels/data busses 308 (referred to hereinafter as memory channels 308). In at least one aspect, memory channels 308 can be 8-bit channels, however the various embodiments are not limited to this aspect(s), and one or more other size channels can be employed for memory channels 308 instead. In some embodiments, memory controller 302 can perform low-level memory operations with memory modules 304, including write, erase, read, etc. In other embodiments, memory controller 302 can perform high-level memory functions with blocks of memory 302, where respective memory controllers (not depicted) within respective memory modules 304 translate high-level memory functions (e.g., host read, write, erase commands, . . . ) to low-level memory functions (e.g., memory read, memory write, memory erase, etc.), and carry out the low-level memory functions.

In various disclosed embodiments, memory controller 302 can further comprise an error correction component 312 incorporating an ECC. In at least one embodiment, the ECC algorithm can be a relatively non-complex ECC (e.g., a Hamming code, a Bose-Chaudhuri [BCH] code, a Reed-Solomon [RS] code, or the like), because of the low bit error rate due to the overwrite capability (e.g., reducing P/E cycles which leads to reduced error rate) of one or more of memory modules 304. In other embodiments, the ECC can alternatively incorporate more complex algorithms, such as a low density parity check [LDPC] code, or the like. Memory controller 302 can also comprise a buffer memory 314 and central processing unit 316 in an embodiment, for performing memory operations on memory modules 304. In still other embodiments, memory device 300 can comprise a RAM 318 (e.g., dynamic RAM, or other suitable RAM) for temporary storage, high speed operating memory, or other purposes that would be evident to one of ordinary skill in the art, which are considered within the scope of the subject disclosure.

Memory modules 304 can comprise an array(s) of memory cells for storing digital information, control hardware for accessing and writing the information, buffering memory (e.g., RAM, or the like) to facilitate control hardware processes and memory translation operations, cache, or the like, or a suitable combination thereof. In some embodiments, the array(s) of memory cells can comprise a crossbar arrangement of two-terminal memory cells (e.g., resistive memory cells, resistive-switching memory cells, and so on). In the crossbar arrangement, intersecting wordlines and bitlines of the memory arrays can be configured to facilitate applying an electrical signal to one or more of the two-terminal memory cells. Furthermore, memory modules 304 can comprise a two-terminal memory cell technology that can be directly overwritten, providing WA value of one to memory device 300. Examples of such two-terminal memory cell technology can include, but are not limited to, resistive memory cells such as resistive-switching memory, resistive random access memory, or the like, or a suitable combination thereof. By utilizing a crossbar arrangement of two-terminal memory cells having a WA value of one, the inventors of the subject application believe memory device 300 can provide great flexibility in performing memory operations. Particularly, memory modules 304 can directly overwrite selected memory cells of respective arrays of memory cells. The inventors believe that memory device 300 can mitigate or avoid what is, in their opinion, a drawback of NAND FLASH, the inability of NAND FLASH to directly overwrite a memory cell without first erasing a block of memory in which the memory cell resides. This characteristic of NAND FLASH leads to high write amplification values (e.g., between 3 and 4), device overhead for garbage collection functions, complex error correction code (ECC) algorithms, and so on. Accordingly, memory device 300 and memory modules 304 can have a significant advantage in operational efficiency, memory retention, memory longevity, read and write speeds, as well as other characteristics, due to the direct overwrite capability described herein.

In alternative or additional embodiments of the subject disclosure, an array(s) of memory within one or more of memory modules 304 can respectively comprise multiple blocks of memory, wherein at least one of the respective blocks of memory comprise multiple sub-blocks of memory. Example schematic diagrams of a sub-block of memory are depicted by FIGS. 1 and 2, supra. A sub-block of memory is associated with one subset of the bitlines of an associated one of the blocks of memory. The number of the bitline subsets can vary according to different embodiments, as can the number of bitlines in a given subset of the bitlines. Each sub-block and associated subset of the bitlines has an associated set of local wordlines that can be exclusive to the sub-block. Each sub-block also comprises a number of groups of two-terminal memory cells equal to a number of wordlines of the memory modules 304. A single group of memory cells within a sub-block comprises two-terminal memory cells that are connected at one respective end thereof to one local wordline of the sub-block of memory. In addition, the memory cells of each group within a sub-block are connected at another respective end thereof to one bitline of the bitline subset of that sub-block. Because each group of memory cells share a common terminal at one local wordline, leakage currents, also called sneak path currents, can occur within a sub-block of memory along respective local wordlines. For instance, referring back to FIG. 2, supra, if a voltage is applied to bitline $BL_0$ to operate on the left-most two-terminal memory cell in selected row 206, and other bitlines $BL_1$ through $BL_X$ observe a different voltage (e.g., zero volts, or are floating), the common path along the local wordline 210 of selected row 206 will allow sneak path currents to occur between bitline $BL_0$ and each of bitlines $BL_1$ through $BL_X$. These sneak path currents can reduce sensing margin of a sensor 322, among other effects.

In various embodiments of the subject disclosure, memory modules 304 can be configured according to an I/O configuration (e.g., see FIGS. 4, 5 and 6, infra) to alleviate the effect of sneak path currents on a memory operation. For an I/O-based connection, two or more memory cells of a group of such memory cells (e.g., a byte, a word, multiple words, a page, etc.) are selected from multiple sub-blocks of a block of memory. In the memory arrangements of FIGS. 1 and 2, therefore, this group of memory cells will not share a common local wordline. Thus, as one example, a single word of memory can be selected from a group of two-terminal memory cells that reside in sixteen separate sub-blocks of a block of memory. These two-terminal memory cells will be connected to sixteen different local wordlines, exclusive to respective ones of the sixteen sub-blocks of memory. This manner of selection can serve to mitigate or avoid sneak path currents between bitlines connected to respective memory cells of the word of memory. The I/O-based connection can be facilitated by a multiplexer arrangement configured to select a plurality of bitlines from multiple sub-blocks of memory for a memory operation (e.g., see FIG. 4, infra). In one aspect, the number of the plurality of bitlines can equal the number of the multiple sub-blocks, meaning only a single bitline of any given sub-block is selected for a given memory operation. However, other embodiments are permitted, in which the number of the plurality of bitlines is greater than the number of the selected multiple sub-blocks, meaning more than one bitline from one or more of the selected sub-blocks can be selected for the given memory operation. In the latter case, sneak path current between selected bitlines will be larger than the former case, but still less than the case discussed above when all bitlines of a sub-block are activated for the memory operation.

Figure 4:
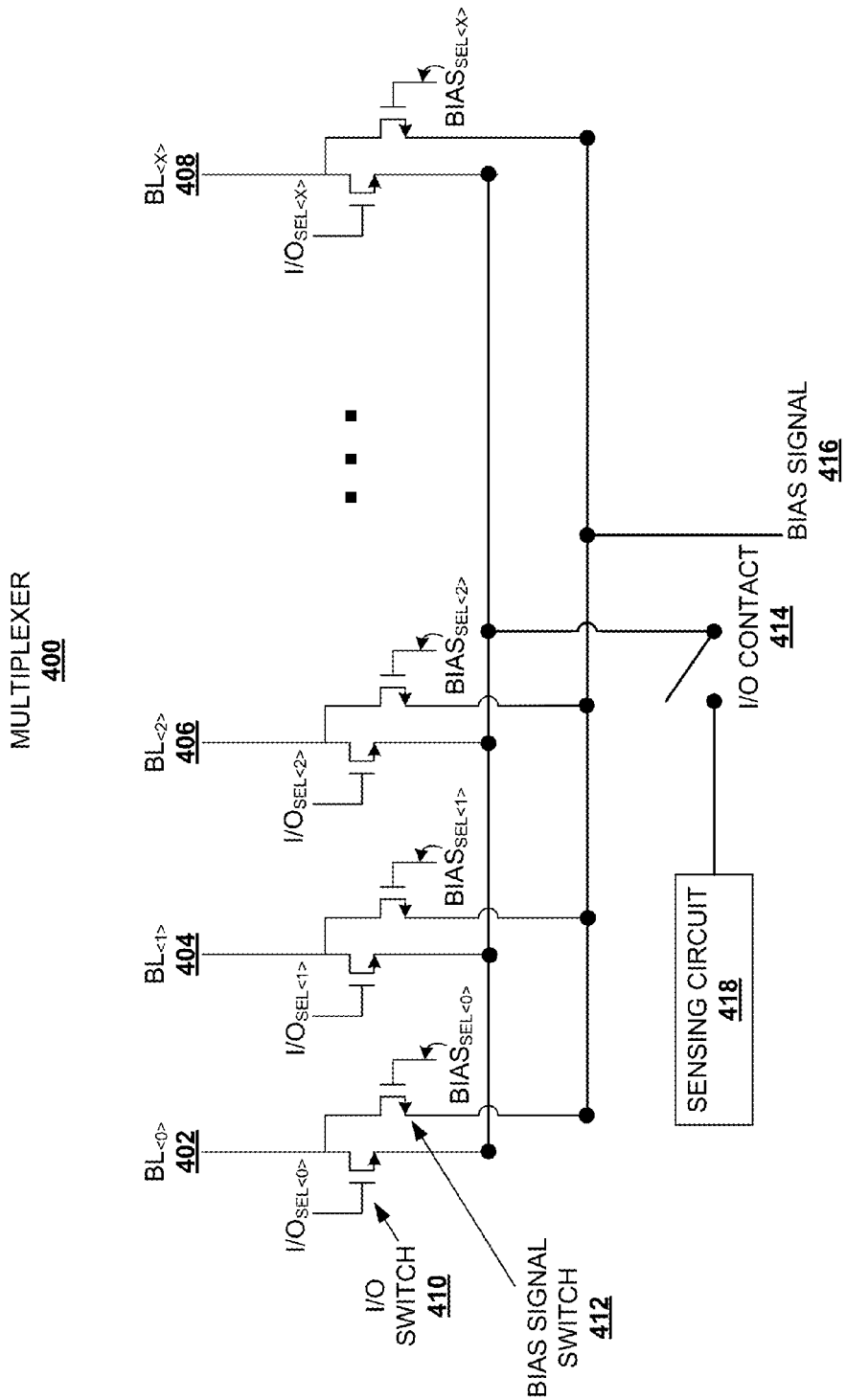
FIG. 4 illustrates a schematic diagram of an example multiplexer for facilitating an input-output (I/O)-based memory architecture, in an embodiment(s).

FIG. 4 illustrates a circuit diagram of an example multiplexer 400 according to one or more particular aspects of the subject disclosure. In one embodiment, a plurality of circuits configured similar to multiplexer 400 can be utilized to selectively connect or disconnect bitlines of respective subsets of a block of memory with a sense amplifier(s), a memory interface (e.g., an I/O contact associated with the memory interface), a power source (e.g., a bias signal associated with a voltage supply, a current supply, etc.), or the like, or a suitable combination thereof.

In various embodiments, multiplexer 400 can be configured to selectively interconnect one or more bitlines of a memory array, including bitlines $BL_0$ 402, $BL_1$ 404, $BL_2$ 406, . . . , $BL_X$ 408 (referred to collectively as bitlines 402-408) with a bias signal contact 416, or an I/O contact 414. In one embodiment, I/O contact 414 can be associated with a sensing circuit 418 to facilitate reading selected ones of bitlines 402-408. In this embodiment, multiplexer 400 could serve as a decoder that facilitates reading memory cells. In another embodiment, I/O contact 414 can be associated with a power source to facilitate programming, erasing or overwriting selected ones of bitlines 402-408. In this embodiment, multiplexer 400 could serve as a decoder that facilitates writing to and erasing memory cells. Bias signal contact 416 can be employed to apply a suitable bias signal to one or more of bitlines 402-408. The bias signal can be supplied by an external power source—not depicted (e.g., a voltage source, a current source). The bias signal can be employed to inhibit operation of non-selected ones of bitlines 402-408. For instance, in the event that a first one of bitlines 402-408 is selected for programming and connected to I/O contact 414, other ones of bitlines 402-408 can be connected instead to bias signal contact 416, which can be driven to an inhibit voltage, or left floating, or other suitable signal for mitigating programming of the other ones of bitlines 402-408. As described in more detail below, multiplexer 400 can be configured to select a first subset of bitlines 402-408 to be connected to (or disconnected from) I/O contact 414 (e.g., for programming, reading, erasing, etc.), while concurrently selecting a second subset of bitlines 402-408 to be connected to (or disconnected from) bias signal contact 416 (e.g., for inhibiting of programming, erasing, etc., or other suitable purpose).

In addition to the foregoing, it should be appreciated that multiplexer 400 can be operated to dynamically select different subsets of bitlines 402-408 for connecting or disconnecting to/from I/O contact 414, or to dynamically select different subsets of bitlines 402-408 for connecting or disconnecting to/from bias signal contact 416, for various memory operations. Said differently, selected subsets of bitlines can be dynamically changed for consecutive memory operations. For instance, multiplexer 400 can select a first subset of bitlines 402-408 to connect to bias signal contact 416 for a first memory operation, and then select a second subset of bitlines 402-408, different from the first subset of bitlines 402-408, to connect to bias signal contact 416 for a second memory operation, and so on. Likewise, multiplexer 400 can select a third subset of bitlines 402-408 (different from the first subset, the second subset) to connect to I/O contact 414 for the first memory operation, and then select a fourth subset of the bitlines 402-408 (different from the first subset, the second subset, the third subset) to connect to the I/O contact 414 for the second memory operation, or the like.

Each of bitlines 402-408 has an associated set of switches, including a respective I/O switch 410 and a respective bias signal switch 412. Thus, $BL_{<0>}$ 402 has an associated I/O switch 410 and an associated bias signal switch 412, and likewise for other bitlines 402-408. Respective I/O switches 410 are activated or deactivated by respective I/O select signals ($I/O_{SEL<0>}$, $I/O_{SEL<1>}$, $I/O_{SEL<2>}$, . . . , $I/O_{SEL<X>}$, where X is a suitable positive integer), including $I/O_{SEL<0>}$ for an I/O switch 410 associated with $BL_{<0>}$ 402, $I/O_{SEL<1>}$ for an I/O switch 410 associated with $BL_{<1>}$ 404, and so on. Activation of a particular I/O switch connects a corresponding bitline 402-408 with I/O contact 414 (e.g., for performing a memory operation on the corresponding bitline 402-

408). In addition to the foregoing, respective bias signal switches 412 are activated or deactivated by respective bias select signals ($Bias_{SEL<0>}$, $Bias_{SEL<1>}$, $Bias_{SEL<2>}$, . . . , $Bias_{SEL<X>}$), including $Bias_{SEL<0>}$ for a bias signal switch 412 associated with $BL_{<0>}$ 402, $Bias_{SEL<1>}$ for a bias signal switch 412 associated with $BL_{<1>}$, and so on. Activation of a particular bias signal switch 412 connects a corresponding bitline 402-408 with bias signal contact 416.

In operation, multiplexer 400 can selectively connect a subset of bitlines 402-408 to I/O contact 414, by activating corresponding I/O select signals of the subset of bitlines 402-408, and deactivating corresponding bias select signals of the subset of bitlines 402-408. Other bitlines 402-408 can be isolated from I/O contact 414 by deactivating corresponding I/O select signals of these other bitlines 402-408. Optionally, the other bitlines 402-408 can be inhibited or left floating, by activating the bias select signals of these other bitlines 402-408, thereby connecting the other bitlines 402-408 to bias signal contact 416, which can be connected to an inhibit signal or left floating. In one operational example, multiplexer 400 can be operated so as to connect a first subset of bitlines 402-408 to I/O contact 414, and to connect a second subset of bitlines 402-408 to bias signal 416, or operated to inhibit the second subset of bitlines 402-408.

Figure 5:
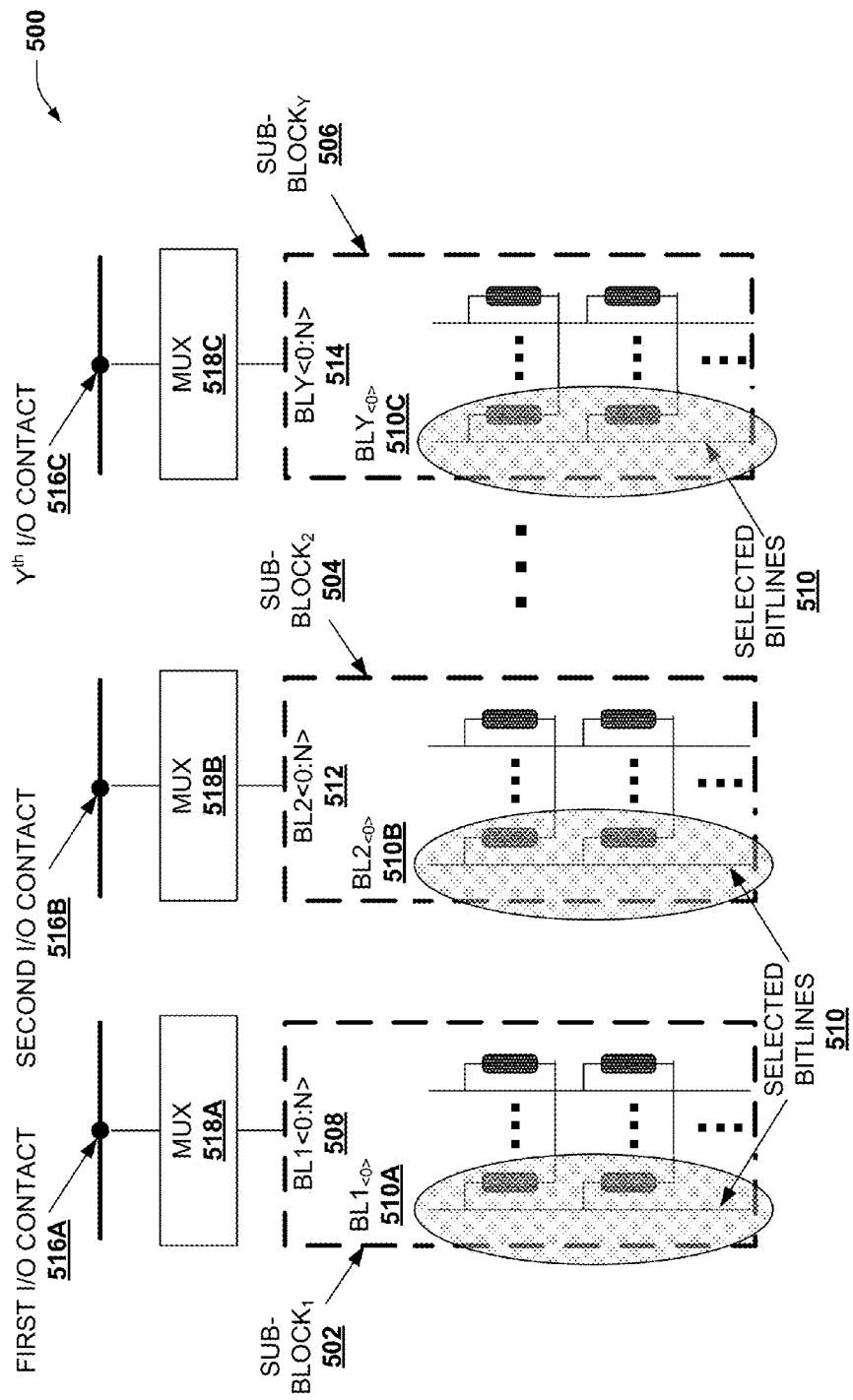
FIG. 5 depicts a schematic diagram of an example circuit for an I/O-based memory architecture, according to further embodiments.

FIG. 5 depicts a block diagram of an example I/O memory configuration 500 according to one or more additional embodiments disclosed herein. I/O memory configuration 500 can facilitate one bit overwrite capability since it can access and perform write, read, and erase on a single bit in a memory sub-block.

I/O memory configuration 500 can comprise a 1Transistor-z Resistor (1TzR) arrangement, in which z is a positive integer greater than 1. In one embodiment, z can have a value of eight, although the subject disclosure is not limited to this embodiment. Those of ordinary skill in the art will appreciate alternate or additional Transistor-Resistor configurations, such as 1T4R, 1T16R, 1T128R and other suitable configurations, which are considered within the scope of the subject disclosure.

In further embodiments, I/O memory configuration 500 can comprise two-terminal memory cells having direct overwrite capabilities. Memory cells having overwrite capabilities can be effective with I/O memory configuration 500. Because of efficient overwrite capabilities, the two-terminal memory cells employed for I/O memory configuration 500 can provide WA value smaller than many types of comparable memory configurations (e.g., NAND FLASH). In particular embodiments, the WA value can be 2 or less. In at least one embodiment, the WA value can be 1. Accordingly, in some embodiments, I/O memory configuration 500 can be employed as part of a memory storage device and facilitate improved data retention and device longevity, due to lower P/E cycles associated with the low WA value. Further, the inventors of the present application believe that such a memory storage device can have significantly lower overhead than devices that incorporate garbage collection algorithms, complex ECC codes, and complex wear-leveling algorithms.

I/O memory configuration 500 can comprise multiple sub-blocks of memory, including sub-block$_1$ 502, sub-block$_2$ 504, through sub-block$_Y$ 506, where Y is a suitable integer greater than 1. The sub-blocks of memory are referred to collectively as sub-blocks 502-506. Each of the sub-blocks of memory 502-506 comprises a respective set of N bitlines, where N is a suitable integer greater than 1. Specifically, sub-block$_1$ 502 includes a first set of bitlines $BL_1<0:N>$ 508, sub-block$_2$ 504 includes a second set of bitlines $BL_2<0:N>$ 512, and sub-block$_Y$ 506 includes a $Y^{th}$ set of bitlines $BL_Y<0:N>$ 514 (referred to collectively as sets of bitlines 508, 512, 514). Each of the sets of bitlines 508, 512, 514 comprises a respective set of local wordlines that are exclusive to a respective one of the sets of bitlines 508, 512, 514. Groups of memory cells can be activated by activating a global wordline associated with a particular group of memory cells, and by a signal applied to a select line affecting a particular sub-block of memory 502-506 (e.g., see FIGS. 1 and 2 for illustration of global wordlines and select lines for a sub-block of memory). Particular memory cells of an activated group of memory cells can be addressed by individual bitlines of one of the sets of bitlines 508, 512, 514 associated with the activated group.

FIG. 5 illustrates a group of selected bitlines 510, including $BL_1<0>$ 510A of sub-block$_1$ 502, $BL_2<0>$ 510B of sub-block$_2$ 504, through $BL_Y<0>$ 510C of sub-block$_Y$ 506, where each bitline 510A, 510B, 510C of the group of selected bitlines 510 is a member of a different sub-block of memory 502-506. Because each sub-block of memory 502-506 has local wordlines exclusive to that sub-block of memory 502-506, no direct path exists along any local wordline of I/O memory configuration 500 between bitlines of different sub-blocks of memory 502-506. Accordingly, memory operations associated with the selected group of bitlines can have minimal sneak path currents between the selected bitlines 510. This minimal sneak path current facilitates higher numbers of z in a 1TzR memory arrangement, improving overall memory density of I/O memory configuration 500.

In operation, I/O memory configuration 500 can comprise a set of multiplexers to connect subsets of the sets of bitlines 508, 512, 514 with respective I/O contacts. The set of multiplexers includes a multiplexer 518A operable with respect to sub-block$_1$ 502, a multiplexer 518B operable with respect to sub-block$_2$ 504, through a multiplexer 518C operable with respect to sub-block$_Y$ 506 (referred to collectively as multiplexers 518A-518C). Respective multiplexers 518A-518C can be configured to selectively connect or disconnect a subset of respective sets of bitlines 508, 512, 514 with a first I/O contact 516A, a second I/O contact 516B through a $Y^{th}$ I/O contact 516C (referred to collectively as I/O contacts 516A-516C). In the example depicted by FIG. 5, a left-most bitline 510A, 510B, 510C (referred to collectively as left-most bitlines 510A-510C) of respective sub-blocks 502-506 comprise selected bitlines 510, which are connected by respective multiplexers 518A-518C to respective I/O contacts 516A-516C. Through the I/O contacts 516A-516C, memory cells of the left-most bitlines 510A-510C can be targeted for a memory operation. In some embodiments, I/O contacts 516A-516C can be connected to a power source, so that power can be applied to left-most bitlines 510A-510C (in conjunction with a select line of respective sub-blocks of memory 502-506, e.g., see FIG. 6, infra) to facilitate writing, erasing or overwriting one or more memory cells on the left-most bitlines 510A-510C. In alternative or additional embodiments, I/O contacts 516A-516C can be connected to a sensor (e.g., see sensing circuit 418 of FIG. 4, supra), so that left-most bitlines 510A-510C can be read as part of a read operation.

It should be appreciated that although I/O memory configuration 500 illustrates a set of selected bitlines 510, one from each sub-block of memory 502-506, other numbers of selected bitlines 510 can be activated for a memory operation instead. For instance, more or fewer selected bitlines 510 can be activated. In at least one embodiment, a single bitline can be selected for a memory operation. Particularly in the case of a refresh or overwrite operation, a memory granularity of a single bitline/memory cell can result in a great flexibility for overwriting or refreshing data. It should be appreciated that other numbers of bitlines can be connected to I/O contacts 516A-516C, up to all of the respective sets of bitlines 508, 512, 514 in at least one embodiment. According to the latter embodiment(s), for instance in conjunction with a mass write or mass erase operation, I/O memory configuration 500 can perform a page erase, sub-block erase, block erase, etc., or a page/sub-block/block write, as suitable.

Figure 6:
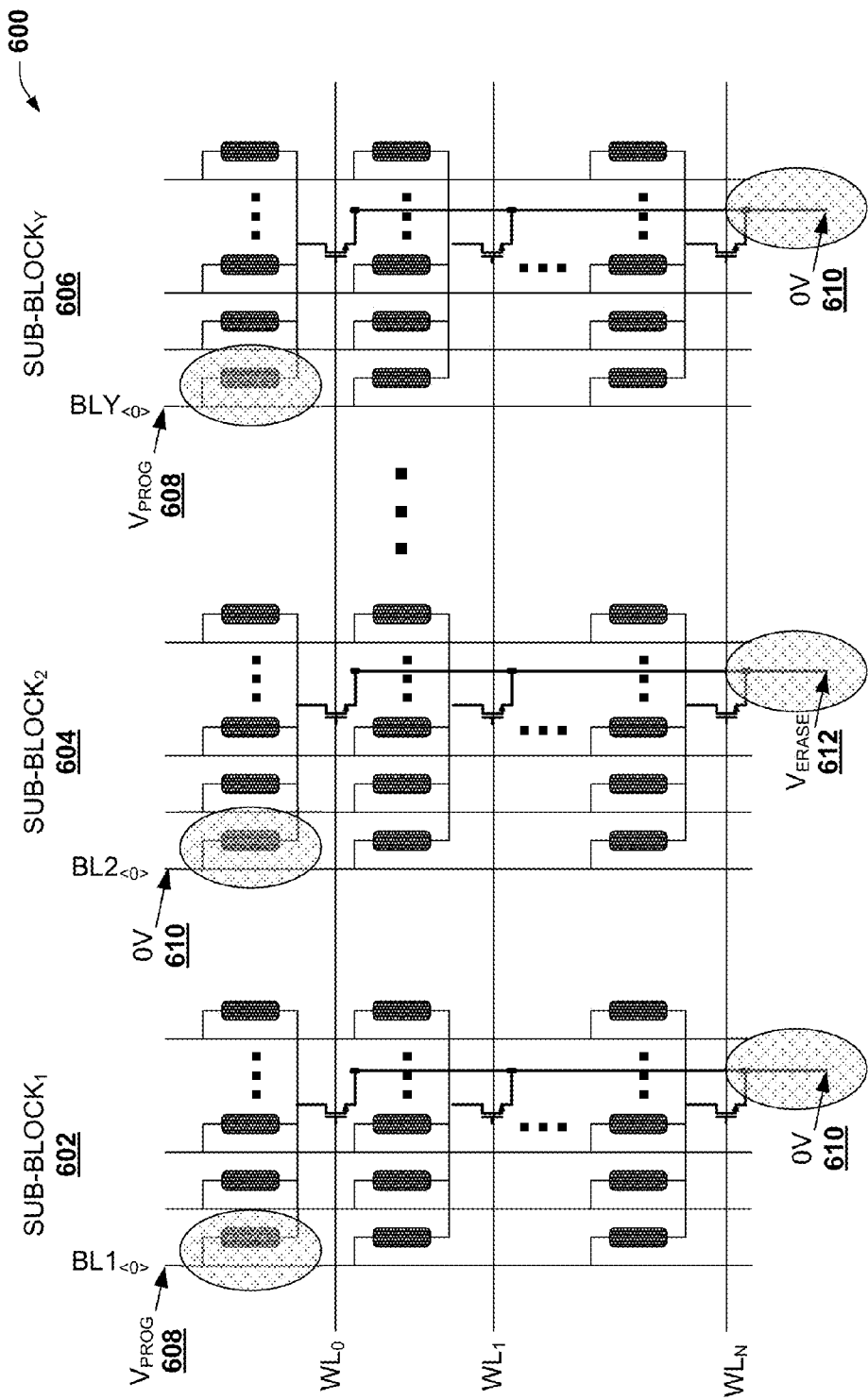
FIG. 6 illustrates a schematic diagram of an example write or overwrite operation for a three-bit digital information unit, in other embodiments.

FIG. 6 depicts a schematic diagram of an example memory operation 600 according to further embodiments of the subject disclosure. In one or more embodiments, memory operation 600 can comprise an I/O-based memory operation. Thus, in such embodiments, multiple memory cells targeted for memory operation 600 are selected from distinct subsets of a memory array that are not directly connected on a wordline or local wordline. Accordingly, memory operation 600 has a degree of inherent sneak path mitigation for memory operation 600.

Memory operation 600 operates on a block of memory comprising a set of sub-blocks of memory, including sub-block$_1$ 602, sub-block$_2$ 604, through sub-block$_Y$ 606 (referred to collectively as sub-blocks of memory 602-606). A group of memory cells, selected from a single respective bitline from each sub-block of memory 602-606, can be targeted for a memory operation (e.g., a write operation, an overwrite operation, a read operation, an erase operation, a refresh operation, and so on). Note that the group of memory cells can vary in size for various disclosed embodiments, from a single memory cell on a single bitline, to a page of memory cells on all the bitlines intersecting a wordline or multiple wordlines, to all the memory cells of a block of memory, or some other suitable combination of memory cells.

Memory cells selected for a memory operation, three in total in this instance, are enclosed in a shaded oval in the depiction of FIG. 6. In this case, a three-bit information 1-0-1 is programmed to the three selected memory cells. Note that this three-bit information can be programmed to the three selected memory cells regardless of whether they currently are erased or programmed, in at least one embodiment. To accomplish programming the three-bit information, a program signal 608 is applied to BL$_1$<0> of sub-block$_1$ 602, and to BL$_Y$<0> of sub-block$_Y$ 606, as depicted, and ground or zero voltage 610 is applied to a source line of sub-block$_1$ 602 and sub-block$_Y$ 606. This applies a positive voltage signal to the selected memory cells in these sub-blocks 602, 606, programming these targeted cells to a logical state of 1. In addition, zero volts 610 or ground is applied to BL$_2$<0> of sub-block$_2$ 604, and an erase signal 612 is applied to a source line of sub-block$_2$ 604, erasing this targeted cell to a logical state of 0. In one embodiment, erase signal 612 can have the same magnitude as program signal 608. In another embodiment, erase signal 612 and program signal 608 can have different magnitudes.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a deposition process can comprise a fill or etching process, an anneal process, or the like, or vice versa, to facilitate deposition, filling or etching of memory cell layers by way of an aggregate process. Components of the disclosed architectures can also interact with one or more other components not specifically described herein but known by those of skill in the art.

Figure 7:
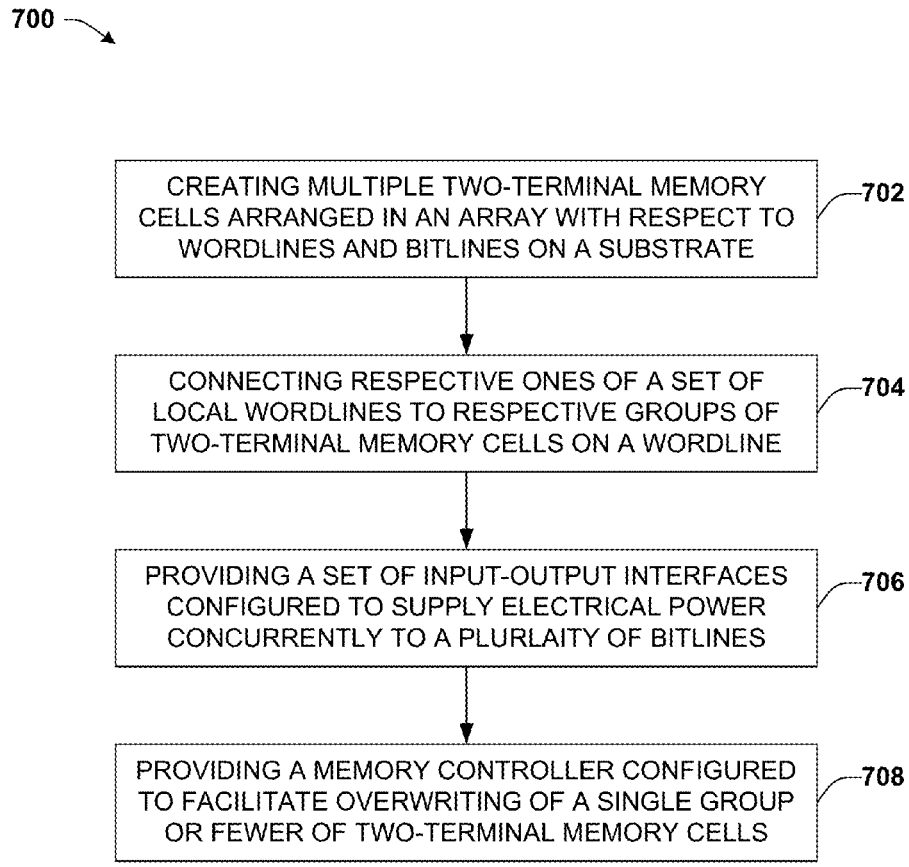
FIG. 7 illustrates a flowchart of an example method for fabricating a memory system having low WA according to one or more embodiments disclosed herein.
Figure 8:
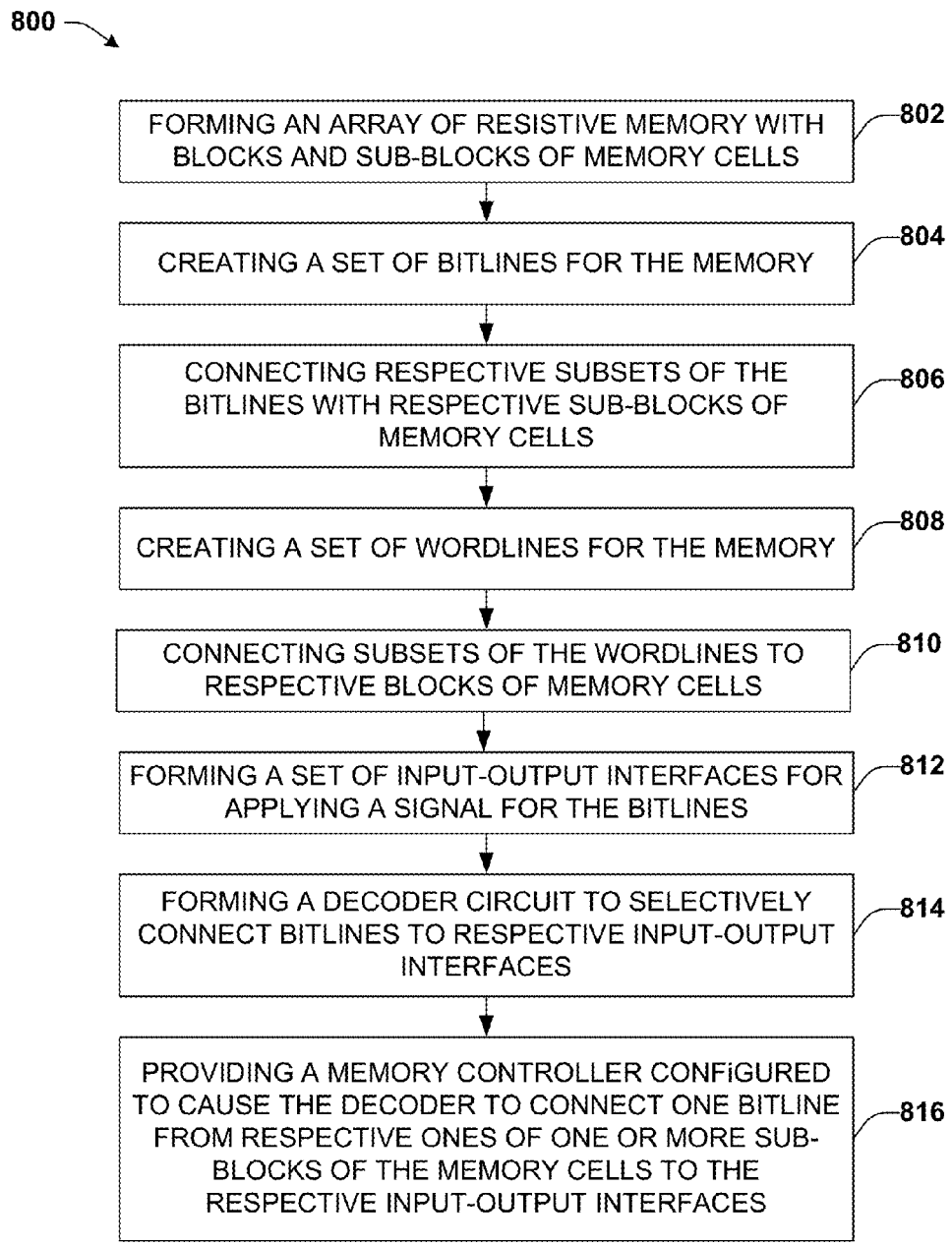
FIG. 8 depicts a flowchart of a sample method for fabricating a digital storage device, thereby providing low WA memory systems in further embodiments.
Figure 9:
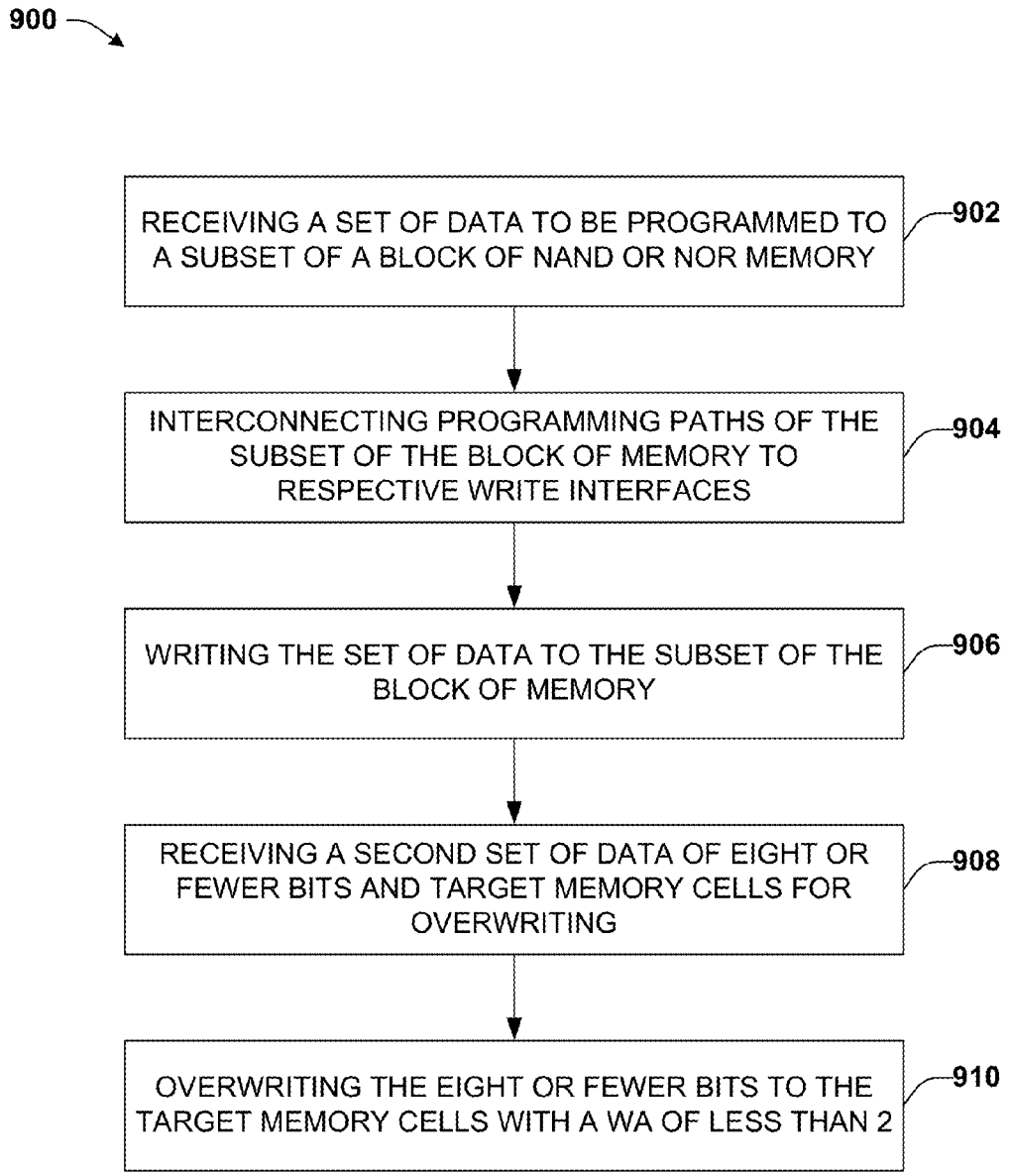
FIG. 9 illustrates a flowchart of an example method for overwriting a subset of a two-terminal digital storage device according to other embodiments.

In view of the exemplary diagrams described supra, process methods that can be implemented in accordance with the disclosed subject matter will be better appreciated with reference to the flow charts of FIGS. 7, 8 and 9. While for purposes of simplicity of explanation, the methods of FIGS. 7, 8 and 9 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

FIG. 7 illustrates a flowchart of an example method 700 for fabricating a memory device, according to further embodiments of the subject disclosure. At 702, method 700 can comprise creating multiple two-terminal memory cells arranged in an array with respect to wordlines and bitlines on a substrate. The two-terminal memory cells can be resistive memory cells in one embodiment (e.g., a resistive-switching memory, a resistive random access memory, or the like). In other embodiments, another two-terminal memory technology can be employed for the multiple two-terminal memory cells. In various embodiments, method 700 can further comprise arranging the multiple two-terminal memory cells into a plurality of memory blocks, respectively having a plurality of sub-blocks of the two-terminal memory cells.

At 704, method 700 can comprise connecting respective ones of a set of local wordlines to respective groups of two-terminal memory cells on a single wordline within one of the sets of wordlines. In an embodiment, the set of local wordlines can be exclusive to one of the plurality of blocks of memory. In an additional embodiment, the groups of two-terminal memory cells can be exclusive to one of the plurality of sub-blocks associated with the one of the plurality of blocks of memory.

At 706, method 700 can comprise providing a set of input-output interfaces configured to supply electrical power concurrently to a plurality of the bitlines or to a plurality of the wordlines. In various embodiments, the set of input-output interfaces can be configured to connect to a subset of the two-terminal memory cells in an I/O memory configuration. In some embodiments, the set of input-output interfaces can be arranged to selectively connect or disconnect the plurality of bitlines or the plurality of wordlines to a sensing circuit for reading a subset of the two-terminal memory cells.

At 708, method 700 can comprise providing a memory controller configured to facilitate directly overwriting a number of two-terminal memory cells. In various embodiments, the memory controller can be provided so as to overwrite the two-terminal memory cells without first erasing a block of memory within which the two-terminal memory cells reside, or without first erasing the two-terminal memory cells themselves. In another embodiment, the memory controller can be provided so as to overwrite a number of the two-terminal memory cells that is smaller than a single page of the two-terminal memory cells. In at least one embodiment, the memory controller can be provided so as to overwrite multiple words of two-terminal memory cells, a single word of two-terminal memory cells, or as few as a single one of the two-terminal memory cells.

FIG. 8 depicts a flowchart of an example method 800 for fabricating a memory array according to additional embodiments of the present disclosure. At 802, method 800 can comprise forming an array of resistive memory cells. Forming the array can further comprise arranging the resistive memory cells into multiple blocks of memory. In some embodiments, arranging the resistive memory cells into multiple blocks of memory can further comprise arranging the resistive memory cells in respective ones of the multiple blocks of memory cells into multiple sub-blocks of memory cells.

At 804, method 800 can comprise creating a set of bitlines for the array of resistive memory cells. At 806, method 800 can comprise connecting respective subsets of the bitlines with respective sub-blocks of memory cells. At 808, method 800 can comprise creating a set of wordlines for the memory. At 810, method 800 can comprise connecting subsets of the wordlines to respective blocks of the memory cells. At 812, method 800 can comprise forming a set of input-output interfaces for applying a signal to respective bitlines of a plurality of subsets of bitlines. At 814, method 800 can comprise forming a decoder or multiplexing circuit configured to selectively connect respective bitlines of subsets of the bitlines to respective ones of the input-output interfaces. At 816, method 800 can comprise providing a memory controller configured to cause the decoder/multiplexer to connect one bitline from respective ones of one or more sub-blocks of the memory cells to the respective input-output interfaces, to facilitate an I/O-based memory configuration for the array of resistive memory cells.

FIG. 9 illustrates a flowchart of a sample method 900 for operating a memory array according to one or more other embodiments disclosed herein. At 902, method 900 can comprise receiving a set of data to be programmed to a subset of a block of memory of a logical NAND or logical NOR based non-volatile solid state memory. At 904, method 900 can comprise interconnecting programming paths of the subset of the block of memory to respective ones of a set of write interfaces. At 906, method 900 can comprise writing the set of data to the subset of the block of memory. At 908, method 900 can comprise receiving a second set of data of eight or fewer bits and a corresponding number of memory cells of the subset of the block of memory to overwrite the second set of data. Further, method 900, at 910, can comprise overwriting the eight or fewer bits to the corresponding number of memory cells with a write amplification of less than 2. Moreover, the overwriting can comprise maintaining the subset of the set of data written to other memory cells of the subset of the block of memory. In at least one embodiment, method 900 can comprise interconnecting a bitline, associated with each of the corresponding number of memory cells and located within separate sub-blocks of the block of memory, with respective ones of a subset of the input-output interfaces. In another embodiment, method 900 can comprise applying a forward polarity program voltage to each bitline connected to one of the eight or fewer bits to be programmed to a logical 1 by the second set of data. In still other embodiments, method 900 can comprise applying a reverse polarity erase voltage to each bitline connected to one of the eight or fewer bits to be programmed to a logical 0 by the second set of data.

Figure 10:
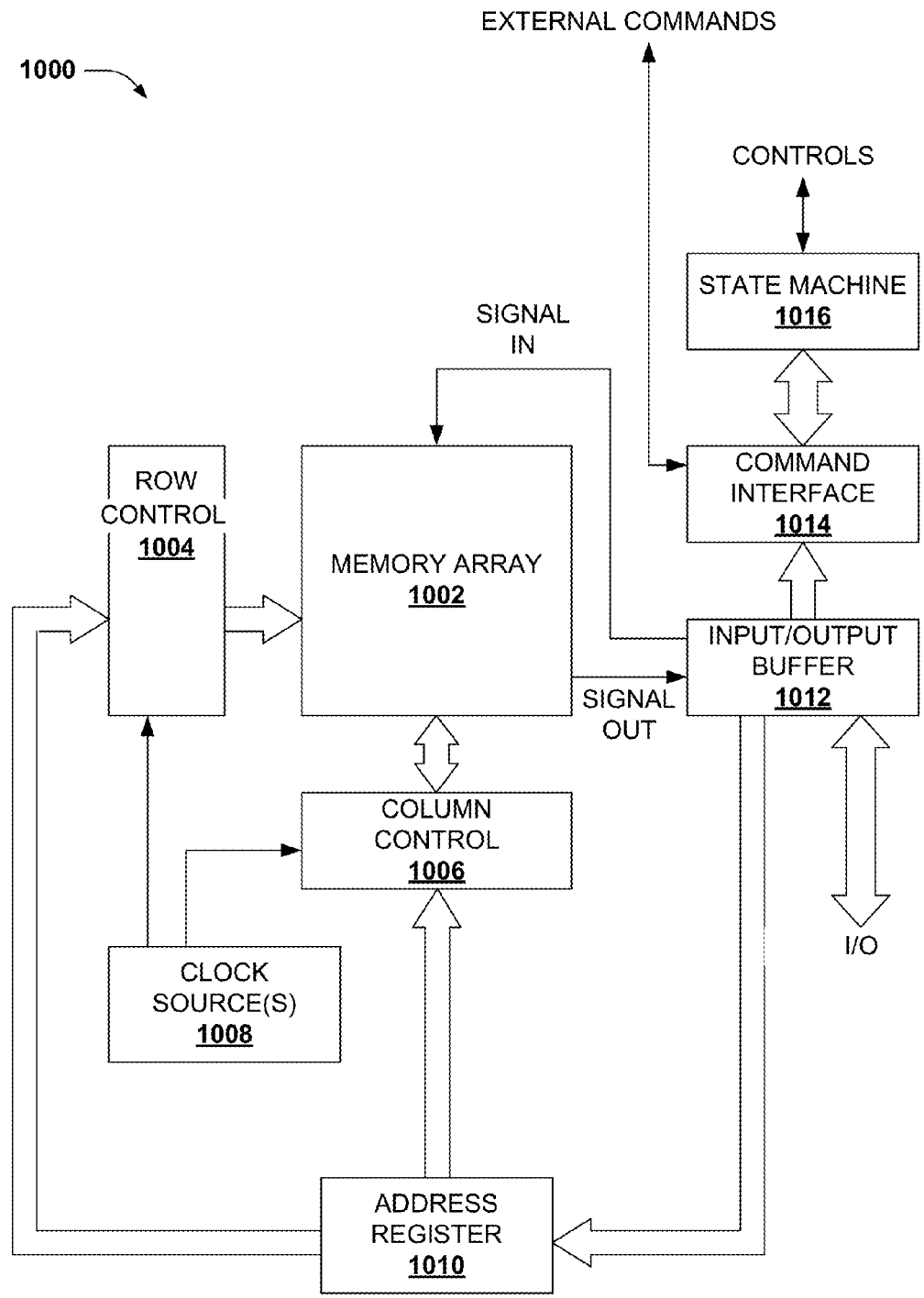
FIG. 10 depicts a block diagram of a sample operating environment for facilitating implementation of one or more aspects disclosed herein.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of semiconductor architectures and process methods for fabricating or operating such architectures, those skilled in the art will recognize that the subject disclosure also can be implemented in combination with other architectures or process methods. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 10 illustrates a block diagram of an example operating and control environment 1000 for a memory cell array 1002 according to aspects of the subject disclosure. In at least one aspect of the subject disclosure, memory cell array 1002 can comprise a variety of memory cell technology. Particularly, memory cell array 1002 can comprise two-terminal memory such as resistive-switching memory cells, as described herein.

A column controller 1006 can be formed adjacent to memory cell array 1002. Moreover, column controller 1006 can be electrically coupled with bit lines of memory cell array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of memory cell array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to memory cell array 1002 via signal input lines, and output data is received from memory cell array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of memory cell array 1002. State machine 1016 receives commands from the host apparatus via input/output interface 1012 and command interface 1014, and manages read, write, erase, data input, data output, and like functionality associated with memory cell array 1002. In some aspects, state machine 1016 can send and receive acknowledgments and negative acknowledgments regarding successful receipt or execution of various commands.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 11, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
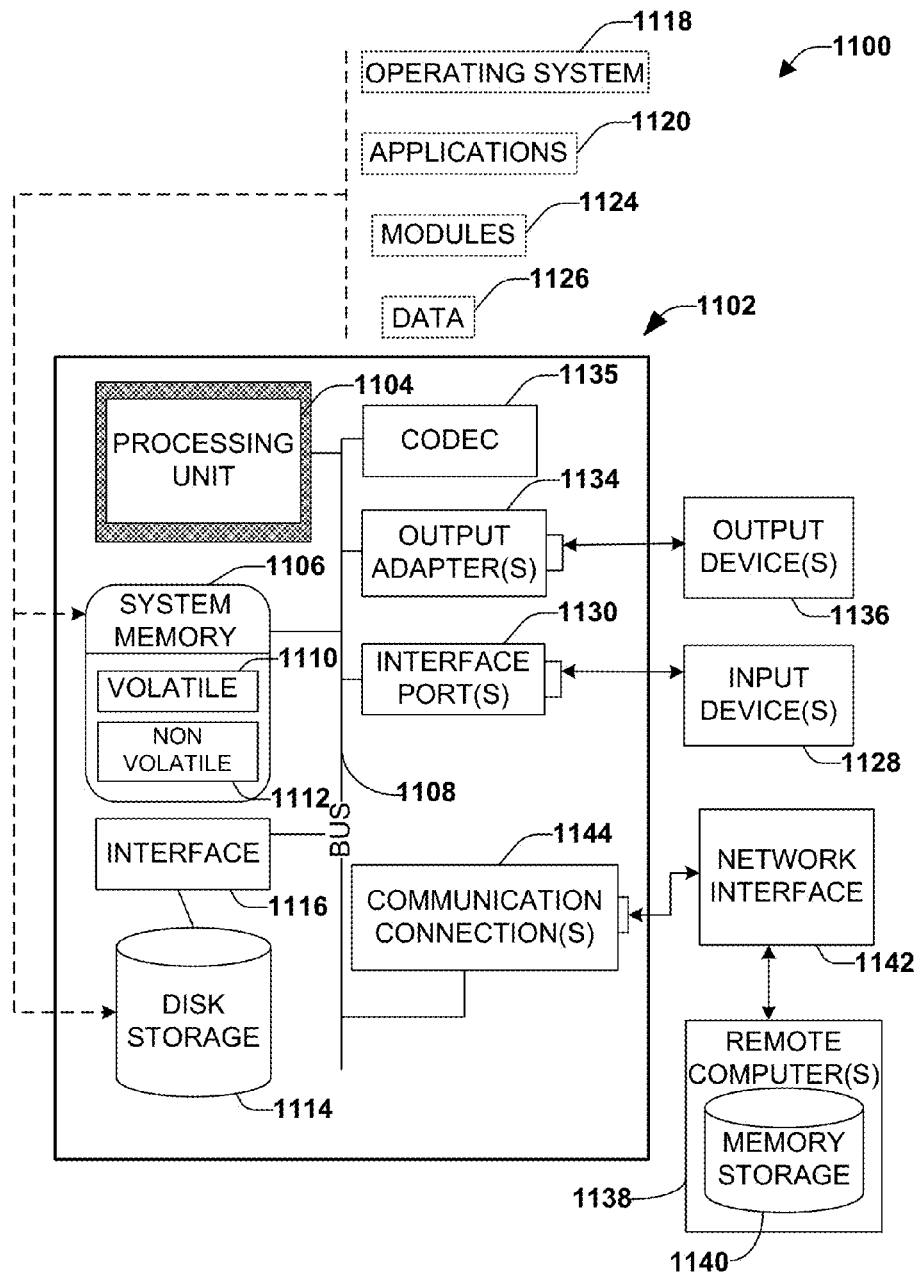
FIG. 11 illustrates a block diagram of an example computing environment that can be implemented in conjunction with various embodiments.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 1110 and non-volatile memory 1112. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or flash memory. Volatile memory 1110 includes random access memory (RAM), which acts as external cache memory. According to present aspects, the volatile memory may store the write operation retry logic (not shown in FIG. 11) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 and/or transmitted to the server or application. The user can be provided the opportunity to opt-in or opt-out of having such information collected and/or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices and/or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A solid state non-volatile memory storage drive configured to be communicatively connected to a computing device, comprising:
    an array of two-terminal memory elements arranged to be operable in conjunction with a plurality of wordlines and a plurality of bitlines; and
    a memory controller configured to access at least a subset of the two-terminal memory elements, the subset comprising equal or less than a page of two-terminal memory elements, and configured to write a set of data to and overwrite the set of data at the subset of the two-terminal memory elements, wherein the memory controller is configured to overwrite the set of data without erasing a physical address location storing the set of data, providing write amplification equal to 1 for the solid state non-volatile memory storage drive.

2. The solid state non-volatile memory storage drive of claim 1, wherein the computing device comprises a memory storage device and a host controller controlling the memory storage device.

3. The solid state non-volatile memory drive of claim 2, further comprising a local wordline connected to respective two-terminal memory elements of the subset of the two-terminal memory elements at respective first terminals thereof, the local wordline configured to be activated by a wordline of the plurality of wordlines, wherein the wordline of the plurality of wordlines is configured to activate a plurality of local wordlines, including the local wordline, that are respectively connected to subsets of the two-terminal memory elements of the page of two-terminal memory elements.

4. The solid state non-volatile memory drive of claim 3, wherein activation of at least one local wordline of the plurality of local wordlines facilitates writing the set of data to and overwriting the set of data at the subset of the two-terminal memory elements connected to the at least one local wordline.

5. The solid state non-volatile memory storage drive of claim 1, wherein the subset comprises 8 or fewer two-terminal memory elements.

6. The solid state non-volatile memory storage drive of claim 1, wherein the subset comprises a single two-terminal memory element.

7. The solid state non-volatile memory storage drive of claim 1, further comprising:
    a set of input-output interfaces;
    a set of local wordlines at least in part controlled by a wordline of the plurality of wordlines; and
    a multiplex component configured to selectively interface respective two-terminal memory elements of a group of two-terminal memory elements with respective input-output interfaces of the set of input-output interfaces in conjunction with a memory operation.

8. The solid state non-volatile memory storage drive of claim 7, wherein the group of two-terminal memory elements includes at least two of the two-terminal memory elements that are connected to separate local wordlines of the set of local wordlines.

9. The solid state non-volatile memory storage drive of claim 8, wherein the multiplex component connects a first two-terminal memory element of the group connected to a first local wordline of the set of local wordlines to a first input-output interface of the set of input-output interfaces in conjunction with the memory operation, and connects a second two-terminal memory element of the group connected to a second local wordline of the set of local wordlines to a second input-output interface of the set of input-output interfaces.

10. The solid state non-volatile memory storage drive of claim 7, wherein:
the memory controller is configured to select the respective two-terminal memory elements of the group of two-terminal memory elements from one two-terminal memory element on each respective local wordline of a subset of the set of local wordlines; and
the multiplex component facilitates interconnection of the one two-terminal memory element on each respective local wordline of the subset of the set of local wordlines of the group of two-terminal memory elements.

11. The solid state non-volatile memory storage drive of claim 7, wherein the multiplex component facilitates interconnection of one of the group of two-terminal memory elements with one of the set of input-output interfaces concurrently with disconnecting or inhibiting remaining two-terminal memory elements of the group from the set of input-output interfaces.

12. The solid state non-volatile memory storage drive of claim 11, wherein the memory controller is further configured to write to or overwrite the one of the group of two-terminal memory elements without writing to, or overwriting, the remaining two-terminal memory elements of the group.

13. A solid state non-volatile memory storage drive configured to be communicatively connected to a computing device, comprising:
an array of two-terminal memory elements arranged to be operable in conjunction with a plurality of wordlines and a plurality of bitlines;
a set of input-output interfaces;
a set of local wordlines at least in part controlled by one of the plurality of wordlines; and
a multiplex component configured to selectively interface respective two-terminal memory elements of a group of two-terminal memory elements with respective input-output interfaces of the set of input-output interfaces in conjunction with a memory operation, wherein the group of two-terminal memory elements includes at least two of the two-terminal memory elements that are connected to separate local wordlines of a plurality of local wordlines, wherein the multiplex component is further configured to connect a first two-terminal memory element of the group connected to a first local wordline of the plurality of local wordlines to a first input-output interface of the set of input-output interfaces in conjunction with the memory operation, and connect a second two-terminal memory element of the group connected to a second local wordline of the plurality of local wordlines to a second input-output interface of the set of input-output interfaces; and
a memory controller configured to access at least a subset of the two-terminal memory elements, the subset comprising equal or less than a page of two-terminal memory elements, and configured to write a set of data to and overwrite the set of data at the subset of the two-terminal memory elements, providing a write amplification less than 2 and equal to or greater than one.

14. The solid state non-volatile memory storage drive of claim 13, wherein the computing device comprises a memory storage device and a host controller controlling the memory storage device.

15. The solid state non-volatile memory drive of claim 14, further comprising a local wordline connected to respective two-terminal memory elements of the subset of the two-terminal memory elements at respective first terminals thereof, the local wordline configured to be activated by one of the plurality of wordlines, wherein the one of the plurality of wordlines is configured to activate a plurality of local wordlines, including the local wordline, that are respectively connected to respective subsets of the page of two-terminal memory elements.

16. The solid state non-volatile memory drive of claim 15, wherein activation of at least one local wordline of the plurality of local wordlines facilitates writing the set of data to and overwriting the set of data at the respective subsets of two-terminal memory elements connected to the at least one local wordline.

17. The solid state non-volatile memory storage drive of claim 13, wherein the memory controller is configured to overwrite the set of data without erasing a physical address location storing the set of data, providing write amplification equal to 1 for the solid state non-volatile memory drive.

18. The solid state non-volatile memory storage drive of claim 13, wherein the subset comprises 8 or fewer two-terminal memory elements.

19. The solid state non-volatile memory storage drive of claim 13, wherein the subset comprises a single two-terminal memory element.

20. The solid state non-volatile memory storage drive of claim 13, wherein:
the memory controller is configured to select the respective two-terminal memory elements of the group of two-terminal memory elements from one two-terminal memory element on each respective local wordline of a subset of the set of local wordlines; and
the multiplex component facilitates interconnection of the one two-terminal memory element on each respective local wordline of the subset of the set of local wordlines of the group of two-terminal memory elements.

21. The solid state non-volatile memory storage drive of claim 13, wherein the multiplex component facilitates interconnection of one two-terminal memory element of the group of two-terminal memory elements with one input-output interface of the set of input-output interfaces concurrently with disconnecting or inhibiting remaining two-terminal memory elements of the group from the set of input-output interfaces.

22. The solid state non-volatile memory storage drive of claim 21, wherein the memory controller is further configured to write to or overwrite the one two-terminal memory element of the group of two-terminal memory elements without writing to, or overwriting, the remaining two-terminal memory elements of the group.

* * * * *